(12) United States Patent
Boutillon et al.

(10) Patent No.: US 10,361,723 B2
(45) Date of Patent: Jul. 23, 2019

(54) DECODING OF NON-BINARY LDPC CODES

(71) Applicants: UNIVERSITE DE BRETAGNE SUD, Lorient (FR); CENTRE NATIONAL DE LA RECHERCHE SCIENTIFIQUE—CNRS-, Paris (FR)

(72) Inventors: Emmanuel Boutillon, Lorient (FR); Oussama Abassi, Lorient (FR); Laura Conde-Canencia, Lorient (FR)

(73) Assignees: UNIVERSITE DE BRETAGNE SUD, Lorient (FR); CENTRE NATIONAL DE LA RECHERCHE SCIENTIFIQUE—CNRS, Paris (FR)

( * ) Notice: Subject to any disclaimer, the term of this patent is extended or adjusted under 35 U.S.C. 154(b) by 0 days.

(21) Appl. No.: 15/110,349

(22) PCT Filed: Jan. 7, 2015

(86) PCT No.: PCT/EP2015/050135
§ 371 (c)(1),
(2) Date: Jul. 7, 2016

(87) PCT Pub. No.: WO2015/104275
PCT Pub. Date: Jul. 16, 2015

(65) Prior Publication Data
US 2016/0336967 A1   Nov. 17, 2016

(30) Foreign Application Priority Data
Jan. 7, 2014   (FR) ..................................... 14 50086

(51) Int. Cl.
*H03M 13/11* (2006.01)
(52) U.S. Cl.
CPC .... *H03M 13/1128* (2013.01); *H03M 13/1117* (2013.01); *H03M 13/1171* (2013.01)

(58) Field of Classification Search
CPC ..................... H03M 13/1128; H03M 13/1117
See application file for complete search history.

(56) References Cited

U.S. PATENT DOCUMENTS

| | | | |
|---|---|---|---|
| 9,621,187 B2* | 4/2017 | Kwok | H03M 13/09 |
| 2005/0138519 A1* | 6/2005 | Boutillon | H03M 13/1111 |
| | | | 714/752 |

(Continued)

OTHER PUBLICATIONS

E. Li, D. Declercq and K. Gunnam, "Trellis-Based Extended Min-Sum Algorithm for Non-Binary LDPC Codes and its Hardware Structure," in IEEE Transactions on Communications, vol. 61, No. 7, pp. 2600-2611, Jul. 2013.*

(Continued)

*Primary Examiner* — Steve N Nguyen
(74) *Attorney, Agent, or Firm* — Patterson Thuente Pedersen, P.A.

(57) ABSTRACT

A method is proposed for managing a parity-check node calculation unit of an error-correcting code decoder having a representation as a bipartite graph comprising at least one parity-check node, the parity-check node being configured to receive first and second input messages, and to produce an output message, the elements of the input and output messages of the parity-check node comprising a symbol and a measure of reliability associated with the symbol, the first and second input messages containing lists of elements ordered by their measure of reliability. The method comprises: initializing a plurality of $n_{bub}$ FIFO memories with elements calculated from combinations of elements of the first and second input messages, and iteratively determining the values of the output message.

14 Claims, 10 Drawing Sheets

(56) References Cited

U.S. PATENT DOCUMENTS

| | | | | |
|---|---|---|---|---|
| 2011/0066917 | A1* | 3/2011 | Heinrich | H03M 13/1117 714/752 |
| 2012/0240002 | A1* | 9/2012 | Boutillon | H03M 13/1117 714/752 |
| 2013/0212451 | A1* | 8/2013 | Nemati Anaraki | H03M 13/1111 714/773 |
| 2013/0246894 | A1* | 9/2013 | Declercq | H03M 13/256 714/792 |
| 2015/0188568 | A1* | 7/2015 | Myung | H03M 13/1171 714/752 |

OTHER PUBLICATIONS

International Search Report for PCT/EP2015/050135, dated Mar. 3, 2015, 3 pages.

Written Opinion for PCT/EP2015/050135, dated Mar. 3, 2015, 4 pages.

Voicila A et al: "Low-Complexity, EMS Algorithm for Non-Binary LDPC Codes". Proceedings of the 2007 IEEE International Conference on Communications (ICC 2007). Jun. 24-28, 2007, Glasgow, UK, IEEE. Piscataway, NJ, USA. Jun. 2007 (Jun. 2007), pp. 671-676. XP031125748. ISBN: 978-1-4244-0353-0 Section IV.C: "Low complexity implementatin of a check node elementary step2": figure 3.

Boutillon Emmanuel et al: "Design of a GF (64)-LDPC Decoder Based on the EMS Algorithm", IEEE Transactions on Circuits and Systems I: Regular Papers, IEEE, US, vol. 60, No. 10, Oct. 2013 (Oct. 2013). pp. 2644-2656. XP011528051. ISSN: 1549-8328, DOI: 10.1109/TC51.2013.2279186 [retrieved on Sep. 25, 2013] section "V The Check Node Processor": figures 8,9.

Voicila A et al: "Architecture of a low-complexity non-binary LDPC decoder for high order fields". International Symposium on Communications and Information Technologies 2007. ISCIT ' 07, IEEE, Oct. 2007 (Oct. 2007), pp. 1201-1206. XP031166645. ISBN: 978-1-4244-0976-1 section III.B: "Check node elementary step"; figure 5.

"Decoding algorithms for nonbinary LDPC codes over GF(q)", D. Declerrcq and M. Fossorier, IEEE Trans. Commun., vol. 55, No. 4, pp. 633-643, Apr. 2007.

"Bubble check: a simplified algorithm for elementary check node processing in extended min-sum non-binary LDPC decoders", E. Boutillon and L. Conde-Canencia, Electronics Letters, vol. 46, No. 9, pp. 633-634, 2010.

"Design of a GF(64)-LDPC Decoder Based on the EMS Algorithm", Boutillon E., L. Conde-Canencia, A. Al Ghouwayel, IEEE Trans. On Circuits and Systems, vol. 60, No. 10, pp. 2644-2656, Oct. 2013.

* cited by examiner

DECODING OF NON-BINARY LDPC CODES

RELATED APPLICATIONS

The present application is a National Phase entry of PCT Application No. PCT/EP2015/050135, filed Jan. 7, 2015, which claims priority from FR Patent Application No. 14 50086, filed Jan. 7, 2014, said applications being hereby incorporated by reference herein in their entirety.

FIELD OF THE INVENTION

The present invention relates to a method for decoding non-binary LDPC codes, and to a decoder for implementing the method.

BACKGROUND OF THE INVENTION

Error-correcting codes are widely used in many fields of information technology, particularly in the transfer of information between a transmitter and a receiver, and the storing/reading of information on a storage medium.

LDPC codes are error-correcting codes in the linear block code category whose parity-check matrix is sparse ("low-density parity check matrix"), meaning that it contains a small number of non-zero elements in comparison to the total number of elements. As they are linear block codes, they can be characterized by a parity-check matrix, usually denoted H. The parity-check matrix H is linked to a matrix called a code generator matrix, generally denoted G, by the relation $G \cdot H^T = 0$, where $H^T$ denotes the transposed matrix of H. The dimensions M×N of the parity-check matrix correspond, for the number of rows M, to the number of parity-check constraints of the code, and for the number of columns N, to the length of the codewords of the code considered. As the rows of the parity-check matrix H of a linear block code respectively correspond to parity-check constraints which are constructed to be satisfied by the codewords, the equality $v \cdot H^T = 0$ will be satisfied for any codeword $v$.

As a reminder, a Galois field GF(q) is a finite set of q elements in which any element can be described as a function of a primitive element, here denoted $\alpha$. Below, the elements of the Galois field GF(q) will be denoted $\{0, \alpha^0, \alpha^1, \ldots, \alpha^{q-2}\}$.

LDPC codes in which the symbols of the codewords belong to the binary Galois field (order 2), denoted GF(2), are known as binary LDPC codes, while LDPC codes in which the symbols of the codewords belong to a Galois field of order q strictly greater than 2, denoted GF(q), are known as non-binary. Thus, the elements of a parity-check matrix of a non-binary LDPC code belong to a non-binary (q>2) Galois field GF(q) and the matrix products of the above equations will be obtained using the laws of addition and multiplication for the field GF(q), respectively denoted $\oplus$ and $\otimes$ in the following description.

The construction of these codes can also be determined by a set of parity-check equations over GF(q), where one of these equations involving $d_c$ codeword symbols is written: $\Sigma_{k=1}^{d_c} h_{j,k} x_k = 0$ where $h_{j,k}$ are the non-zero values in the jth row of H, and a codeword is denoted by $X=(x_1, x_2, \ldots, x_N)$ where $(x_k)$, $k=1 \ldots N$ is a symbol represented by $m=\log_2(q)$ bits denoted $x_k(x_{k,1} x_{k,2} \ldots x_{k,m})$.

An example of a parity-check matrix H in Galois field GF(4) in which the elements are denoted $\{0; \alpha^0; \alpha^1; \alpha^2\}$, of dimensions M=3 and N=6, is given below:

$$H = \begin{pmatrix} 0 & \alpha^0 & \alpha^0 0 & \alpha^2 & 0 \\ \alpha^1 & 0 & 0\alpha^0 & 0 & \alpha^2 \\ \alpha^0 & 0 & \alpha^2 0 & 0 & \alpha^1 \end{pmatrix}$$

Many iterative algorithms for decoding LDPC codes use a bipartite graph representation of the parity-check matrix for the code, called a "Tanner graph." For a parity-check matrix H of dimensions M×N, this representation uses edges to connect M nodes, called "parity-check nodes" or "check nodes" (CN), with N nodes, called "variable nodes" (VN). Each non-zero element of the parity-check matrix is represented in the corresponding Tanner graph by an edge connecting the parity-check node corresponding to the row of the element in the matrix H to the variable node corresponding to the column of the element in the matrix H. Each parity-check node of the graph thus represents a parity-check equation determined by the edges that connect it to the variable nodes. The variable nodes receive the words to be decoded or that are being decoded.

FIG. 1 shows the Tanner graph corresponding to the above example of a parity-check matrix of dimensions M=3 and N=6. This graph contains M=3 parity-check nodes labeled $CN_1$, $CN_2$ and $CN_3$ in the figure, and N=6 variable nodes labeled $VN_1$, $VN_2$, $VN_3$, $VN_4$, $VN_5$ and $VN_6$ in the figure. The three parity-check equations respectively corresponding to the three parity-check nodes of the graph are:

$\alpha^0 \otimes VN_2 \oplus \alpha^0 \otimes VN_3 \oplus \alpha^2 \otimes VN_5 = 0$ for parity-check node $CN_1$, $\alpha^1 \otimes VN_1 \oplus \alpha^0 \otimes VN_4 \oplus \alpha^2 \otimes VN_6 = 0$ for parity-check node $CN_2$, $\alpha^0 \otimes VN_1 \oplus \alpha^2 \otimes VN_3 \oplus \alpha^1 \otimes VN_6 = 0$ for parity-check node $CN_3$, where the operators $\oplus$ and $\otimes$ respectively indicate addition and multiplication in the Galois field GF(4).

The Tanner graphical representation can be used to implement algorithms of demonstrated efficiency in graphical models, such as the "belief propagation" (BP) algorithm, or "Message passing" (MP) algorithms. When applied to a bipartite graph with two different types of nodes, the BP algorithm is based on an iterative process of sending messages between nodes of each type connected by edges (the nodes are said to be "neighbors").

Iterative algorithms for LDPC decoding using the exchange of messages between the parity-check nodes and variable nodes of the Tanner graph corresponding to the LPDC code in question have thus been developed. These decoding algorithms can be more generally used or adapted for decoding all linear block codes having a representation as a bipartite graph comprising a set of parity-check nodes and a set of variable nodes.

In the case of soft-input decoding, the exchanged messages contain possible values of the symbols of the codewords processed, with associated likelihood or reliability information. For example, when the code concerned is binary, and the symbols of the codewords have values in the Galois field GF(2) or in other words are binary values, the exchanged messages containing probability densities include two densities, one for the value "0" and the other for the value "1". The messages include, for example, pairs of binary values which are respectively associated with likelihood values (or reliability values).

When the code concerned is non-binary, and the symbols of the codewords are values in the Galois field GF(q) with q>2, the messages exchanged may contain q reliability values, each corresponding to an element of GF(q), which can be represented as a vector of size q of (symbol, reliability value) pairs.

A parity-check node of a non-binary LDPC decoder for a code with values in the Galois field GF(q) thus receives $d_c$ input messages and generates $d_c$ output messages. Each input and output message contains q pairs of values, one representing a symbol and the other representing a reliability or likelihood associated with this symbol. If using a direct implementation of the Belief Propagation (BP) decoding algorithm, output is constructed by selecting the q best combinations among q to the power $d_c-1$. This leads to a computational complexity on the order of $O(q^2)$. The BP decoding algorithm can also be considered in the frequency domain. It is then called a Fourier Transform-based BP algorithm. Changing to the frequency domain can reduce the complexity of the BP algorithm to achieve a complexity on the order of $O(d_c \times q \times \log(q))$. However, the cost of implementing the BP algorithm still remains very high in terms of computational complexity, and becomes prohibitive when considering values of q exceeding 16.

Various algorithms have been proposed to solve this high complexity issue, including the Extended Min-Sum (EMS) algorithm, which proposes using truncated messages by selecting the most reliable $n_m$ symbols, $n_m$ being chosen to be well below q ($n_m \ll q$). The messages are then sorted before being introduced to the parity-check node. A parity-check node is composed of a combination of elementary parity-check nodes, where each elementary parity-check node receives two sorted messages each containing $n_m$ (symbol, reliability) pairs from which it generates an output message containing the $n_m$ best possible combinations of two input messages, the total number of combinations being equal to $n_m$ to the power of 2.

One can refer to the following article for a detailed description of the EMS algorithm: "Decoding algorithms for nonbinary LDPC codes over GF(q)", D. Declercq and M. Fossorier, IEEE Trans. Commun., vol. 55, no. 4, pp. 633-643, April 2007.

The "Bubble Check" algorithm and its improved version known as "L-Bubble Check", which aim to further reduce the complexity of the elementary parity-check nodes while maintaining the same performance in terms of error rates, propose reducing the search space of the $n_m$ best possible combinations of the two input messages.

One can refer to the following articles for a detailed description of the Bubble Check and L-Bubble Check algorithms, respectively: "Bubble check: a simplified algorithm for elementary check node processing in extended min-sum non-binary LDPC decoders", E. Boutillon and L. Conde-Canencia, Electronics Letters, vol. 46, no. 9, pp. 633-634, 2010; and "Design of a GF(64)-LDPC Decoder Based on the EMS Algorithm", Boutillon E., L. Conde-Canencia, A. Al Ghouwayel, IEEE Trans. On Circuits and Systems, vol. 60, no. 10, pp. 2644-2656, October 2013.

Although the Bubble-Check algorithm allows reducing the number of calculations in the elementary parity-check nodes, the decoding complexity is still too high to allow truly efficient hardware and/or software implementations.

SUMMARY OF THE INVENTION

An object of the present invention is to provide a method for managing a parity-check node calculation unit of an error-correcting code decoder having a representation as a bipartite graph, as well as a parity-check node calculation unit of an error-correcting code decoder having a representation as a bipartite graph.

According to a first aspect, the invention relates to a method for managing a parity-check node calculation unit of an error-correcting code decoder having a representation as a bipartite graph comprising at least one parity-check node, the parity-check node being configured to receive first (U) and second (V) input messages, and to produce an output message (E), elements of the input and output messages of the parity-check node comprising a symbol and a measure of reliability associated with the symbol, the first and second input messages containing lists U(i) and V(j) of length $n_m$ of elements ordered by their measure of reliability. The proposed method comprises: initializing a plurality of $n_{bub}$ FIFO-type memories with elements calculated, according to a calculation operation $\varphi$ (U(i), V(j)), from combinations of elements of the first and second input messages, said calculation operation v being such that if a≥b and c≥d, then $\varphi(a,c) \geq \varphi(b,d)$, and iteratively determining values of the output message. According to the proposed method, an iteration of order m, where m is an integer greater than or equal to zero, includes selecting from among the output elements from the FIFO memories an element Ss(m) having maximum reliability, generating an element of the output message (E) from the selected element Ss(m), and updating the output of the FIFO memory from which the selected item Ss(m) originated.

The proposed method provides an algorithm which enables a more efficient implementation of an error-correcting code decoder. This implementation provides a significant gain in terms of the surface area used for implementing the decoder in an FPGA component, and in terms of maximum clock frequency for the execution of the proposed method.

In one particular implementation of the proposed method, $n_{bub}$ is equal to four, and the four FIFO memories are initialized with elements from four subsets S1, S2, S3, and S4, generated by combining the measures of reliability respectively associated with elements U(i) and V(j) of the input messages, as follows:

$$S_1 = [\varphi(U(0), V(l)); l \in \{0, \ldots, n_m - 1\}],$$

$$S_2 = [\varphi(V(0), U(l)); l \in \{1, \ldots, n_m - 1\}],$$

$$S_3 = \left[\varphi(U(1), V(l)); l \in \left\{1, \ldots, \frac{n_m}{2} - 1\right\}\right], \text{ and}$$

$$S_4 = \left[\varphi(V(1), U(l)); l \in \left\{2, \ldots, \frac{n_m}{2} - 1\right\}\right].$$

Advantageously, the four FIFO memories are initialized according to their sizes, which are respectively chosen to be equal to:

$$\frac{n_m}{2} - 1, \frac{n_m}{2} - 2, \frac{n_m}{2} - 2, \text{ and } \frac{n_m}{2} - 3.$$

In another particular implementation of the proposed method, the generation of an element of the output message (E) from the selected element Ss(m) is carried out only if the output message E does not already contain said element. This avoids the generation of duplicates in the output message (E).

In another particular implementation of the proposed method, the measure of reliability of each element is represented by a log-likelihood ratio (LLR).

In another particular implementation of the proposed method, the calculation operation φ is an addition.

The proposed method can advantageously be applied to a decoder for non-binary LDPC codes.

A second aspect proposes a parity-check node calculation unit for an error-correcting code decoder having a representation as a bipartite graph, the parity-check node being configured to receive first (U) and second (V) input messages, and to produce an output message (E), elements of the input and output messages of the parity-check node comprising a symbol and a measure of reliability associated with the symbol, the first and second input messages containing lists U(i) and V(j) of length $n_m$ of elements arranged according to their measure of reliability. The proposed calculation unit comprises a computer processor operatively coupled to memory means, the memory means being configured as a plurality of $n_{bub}$ FIFO memories, and an output message generator, executed by the computer processor. The output message generator is preferably configured to initialize the plurality of $n_{bub}$ FIFO memories with elements calculated, according to a calculation operation φ (U(i), V(j)), from combinations of elements of the first and second input messages, said calculation operation φ being such that if a≥b and c≥d, then φ(a,c)≥φ(b,d), and to determine values of the output message iteratively, an iteration of order m, m being an integer greater than or equal to zero, comprising selecting from among the output elements of the FIFO memories an element Ss(m) having maximum reliability, generating an element of the output message (E) from the selected element Ss(m), and updating the output of the FIFO memory from which the selected item Ss(m) originated.

In one particular embodiment of the calculation unit, $n_{bub}$ is equal to four, and the four FIFO memories are initialized with elements from four subsets S1, S2, S3, and S4, generated by combining the measures of reliability respectively associated with elements U(i) and V(j) of the input messages, as follows:

$$S_1 = [\varphi(U(0), V(l)); l \in \{0, \ldots, n_m - 1\}],$$

$$S_2 = [\varphi(V(0), U(l)); l \in \{1, \ldots, n_m - 1\}],$$

$$S_3 = \left[\varphi(U(1), V(l)); l \in \left\{1, \ldots, \frac{n_m}{2} - 1\right\}\right], \text{ and}$$

$$S_4 = \left[\varphi(V(1), U(l)); l \in \left\{2, \ldots, \frac{n_m}{2} - 1\right\}\right].$$

In another particular embodiment of the calculation unit, the generation of an element of the output message (E) from the selected element Ss(m) is carried out only if the output message E does not already contain said element. This avoids the generation of duplicates in the output message (E).

In another particular embodiment of the calculation unit, the measure of reliability of each element is represented by a log-likelihood ratio (LLR).

In another particular embodiment of the calculation unit, the calculation operation φ is an addition.

Another aspect relates to a computer program which can be loaded into memory associated with a processor, and comprising portions of code for implementing steps of the proposed method when said program is executed by the processor, as well as a set of data representing, for example by means of compression or encoding, said computer program.

Another aspect relates to a non-transitory storage medium for a program executable by a computer, containing a set of data representing one or more programs, said one or more programs comprising instructions for, when said one or more programs is executed by a computer comprising a processor operatively coupled to memory means and to an input/output interface module, leading the computer to manage a parity-check node calculation unit according to the proposed methods.

The proposed methods are particularly suitable, although this is not exclusive, to an elementary parity-check node of a decoder for non-binary LDPC error-correcting codes. However, they are also suitable for any parity-check node of an error-correcting code decoder having a representation as a bipartite graph comprising at least one parity-check node.

BRIEF DESCRIPTION OF THE DRAWINGS

Other features and advantages of the invention will become apparent from the following description of some non-limiting exemplary embodiments, with reference to the accompanying drawings, in which.

DETAILED DESCRIPTION OF THE DRAWINGS

In the following detailed description of some embodiments of the invention, many specific details are presented to provide a more complete understanding of the invention. However, the skilled person will realize that some embodiments may be put into practice without these details. In other cases, some well-known features are not described in order to simplify the description.

The invention will be described below in a non-limiting context of a parity-check node of an error-correcting code decoder.

Figure 1:
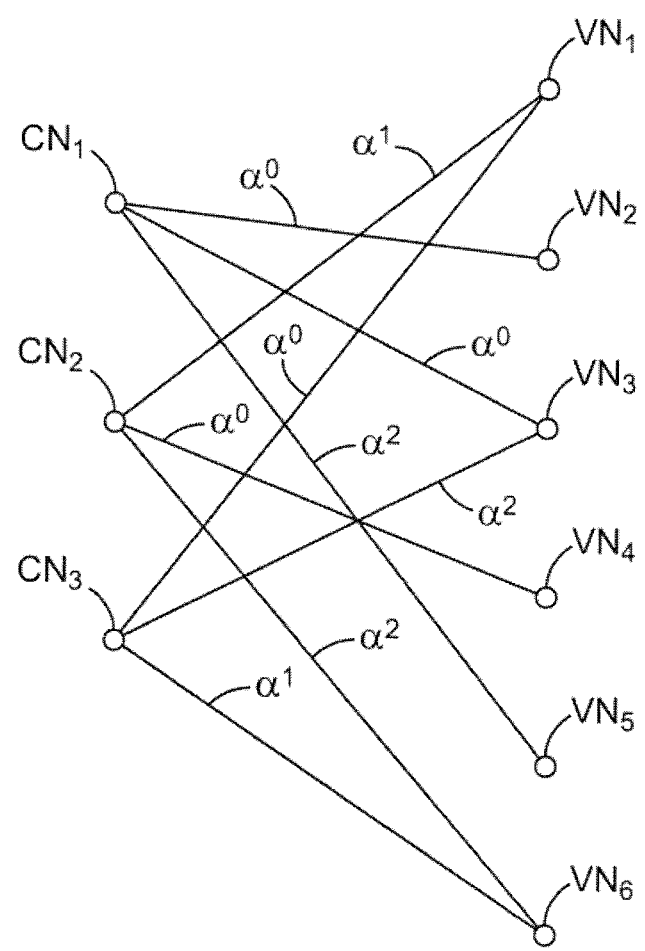
FIG. 1 is a diagram illustrating a bipartite graph representing an error-correcting code in which the proposed methods can be implemented.
Figure 2A:
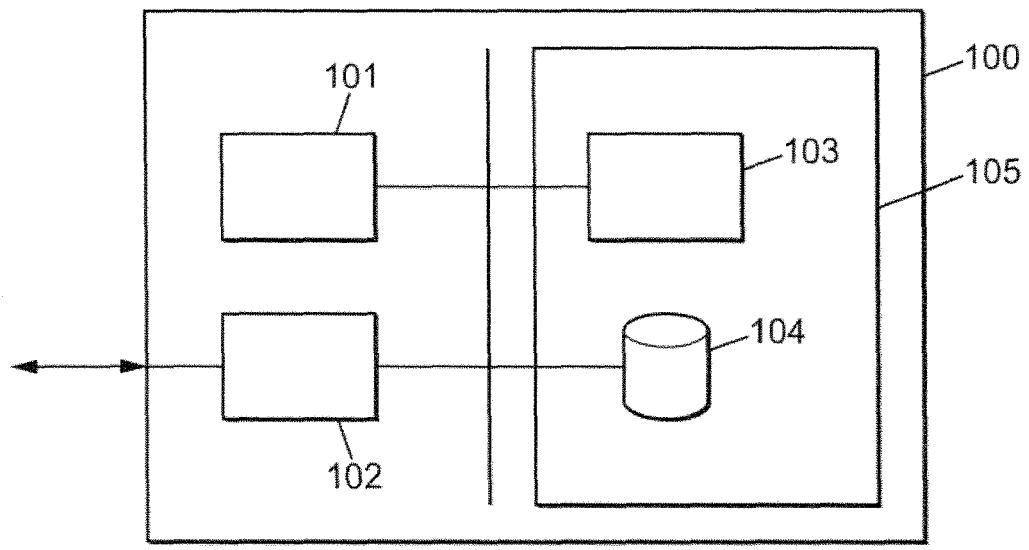
FIG. 2a shows a decoding system where the invention can be applied.

FIG. 2a shows a decoding system (100) comprising a non-binary LDPC decoder (101) according to various embodiments. The system (100) further comprises an input-output interface (102), processing means (103), and memory means (104).

A noisy version v' of the codeword v is received after transmission over a communication channel or after reading from a storage medium. The codeword to be decoded v' by the system (100) is acquired by the interface (102). The data acquisition phase for decoding is followed by a phase of processing the data, carried out for example by a data processing unit 105 which controls the non-binary LDPC decoder 101. The data processing unit 105 may be a computer, a network of computers, or some other device having a processor, a memory, a data storage unit 104, and other associated hardware such as a network interface and a media drive for reading from and writing to a removable storage medium (not shown in the figure). The removable storage medium may be, for example, a compact disc (CD), a digital video disc (DVD), a flash drive, etc. The removable storage medium contains instructions which, when executed by the data processing unit 105, cause the unit 105 to perform the data acquisition and/or processing portion of the examples described herein for implementing the proposed method. The removable storage medium may further comprise one or more computer programs for implementing and executing the LDPC decoding on the decoder 101, then storing the results of this decoding in memory 104. Portions of the LDPC decoder may be stored as ordered sequences of instructions on a given instance of the removable storage media, a removable device, or a local data storage 104, to be loaded into memory for execution by one or more processors. Specifically, software instructions or computer-readable program code for carrying out some embodiments may be stored, temporarily or permanently, in whole or in part, on a non-transitory computer-readable medium such as a compact disc (CD), a local or remote storage device, local or remote memory, a diskette, or any other computer-readable storage device.

Although the LDPC decoder has been described as a program residing in memory, the LDPC decoder can be implemented in hardware as an application specific integrated circuit (ASIC), or as a combination of hardware and software such as a software program to be loaded and run on an FPGA component (Field Programmable Gate Array).

Figure 2B:
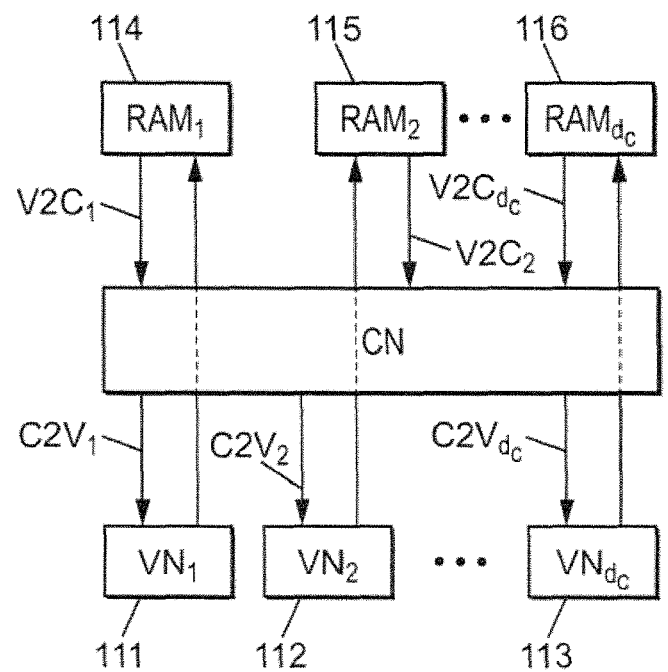
FIGS. 2b and 2c show a check node of an error-correcting code decoder where the invention can be applied.

FIG. 2b illustrates an example architecture of the decoder (101), which comprises a parity-check node processor (110) connected to $d_c$ variable node processors $VN_i$, i=1 ... $d_c$ (of which only three (111), (112), and (113) are represented in the figure) and $d_c$ memory banks, for example RAM, $RAM_i$, i=1 ... $d_c$ (of which only three (114), (115), and (116) are represented in the figure). The parity-check node processor (110) receives in parallel $d_c$ input messages $V2C_i$, i=1 ... $d_c$ respectively coming from memory banks $RAM_i$, i=1 ... $d_c$. After its calculations, it generates $d_c$ output messages $C2V_i$, i=1 ... $d_c$ respectively sent to the variable node processors $VN_i$, i=1 ... $d_c$ (111), (112), and (113). The variable node processors $VN_i$, i=1 ... $d_c$ (111), (112), and (113) then generate messages V2C which will be stored in the memory banks before being input to the parity-check node processor. The parity-check node (110), which receives $d_c$ input messages $V2C_i$, i=1 ... $d_c$ and generates $d_c$ output messages $C2V_i$, i=1 ... $d_c$, is said to be of degree $d_c$.

As indicated above, the messages processed by a parity-check node contain pairs of information representing a possible symbol and a reliability value for this information. As the operations required for calculating reliability values represented by probabilities knowing the received codeword include a large number of multiplications, it is common to use a logarithmic symbol representation for the reliability value, which replaces the multiplications with additions. This allows optimizing the implementations of the decoding in dedicated components (ASIC or FPGA for example).

For example, one can define log-likelihood ratios or LLR which correspond to the reliability information exchanged in messages between the parity-check nodes and variable nodes. The log-likelihood ratio LLR measures the reliability of the symbols while eliminating multiplication operations in the decoder and providing better immunity against quantification errors. One definition of the LLRs uses the probability of a fixed reference symbol in the denominator, for example the symbol $\alpha^0$. Thus, if we denote the noisy symbol received as output from a transmission channel as $\beta$, the definition of the LLR for a symbol $\alpha^i$, i=0, ..., q−1, is given by the following equation:

$$LLR(\alpha^i) = \ln\left(\frac{Pr(\alpha^i \mid \beta)}{Pr(\alpha^0 \mid \beta)}\right)$$

where $Pr(\alpha^i|\beta)$ is the conditional probability of $\alpha^i$ knowing $\beta$.

The above definition can lead to negative values of LLR, particularly when the probability of $\alpha^i$ is less than that of $\alpha^0$. However, for an implementation of the proposed method on a fixed point digital architecture, it is preferable to work with positive values of LLR.

One solution for this is to use the symbol with the smallest reliability as the reference symbol. In the above definition, the most reliable symbols are those that have the highest LLR values. This means increasing the number of bits needed to represent the LLR values, which increases the size of the memory required by the decoder. From this point of view, it is more efficient to define the LLR so that the most reliable symbols have the smallest LLRs (while keeping all LLR values positive). To do this, we can consider the following definition where the absolute value is applied to the calculated LLR values, using the most reliable symbol as the reference symbol.

$$LLR(\alpha^i) = \left|\ln\left(\frac{Pr(\alpha^d \mid \beta)}{Pr(\alpha^i \mid \beta)}\right)\right|;$$

where $\alpha^d$=arg max[$Pr(\alpha^i|\beta)$; i=0, ..., q−1]

The most reliable symbol is thus the one that has the smallest LLR value, meaning the value 0. This allows, for example when the LLR values are encoded in 5 bits, ensuring that the smallest LLR value is equal to the lower bound of the range of positive values represented with 5 bits (from 0 to 31).

Conversely, if working with positive and negative values of LLR while encoding these values in 5 bits, the LLR dynamics may be more poorly represented because the extreme LLR values will not necessarily have been normalized to correspond to one of the bounds of the range represented with 5 bits (from −15 to 16, for example).

Thus, in the Galois field GF(4), if the four probabilities of the elements $\alpha^0$, $\alpha^1$, $\alpha^2$ and $\alpha^3$ are respectively (0.2; 0.5; 0.29; 0.01), the first definition of the LLR gives us:

LLR1=(log(0.2/0.2), log(0.5/0.2), log(0.29/0.2), log(0.01/0.2))=(0 0.9163 0.6678 −2.9957).

The second definition gives us:
LLR2=(log(0.2/0.01), log(0.5/0.01), log(0.29/0.01), log (0.01/0.01))=(2.9957 3.9120 3.6636 0)
(changing from LLR1 to LLR2 by adding a constant factor of 2.9957)

The third definition gives us:
LLR3=(log(0.5/0.2), log(0.5/0.5), log(0.5/0.029), log(0.5/ 0.01))=(0.9163 0 0.2485 3.9120).

The data processing in the parity-check node processor (110) can be performed according to the "forward-backward" algorithm, in which a parity-check node of degree $d_c$ is broken down into 3. (dc−2) parity-check nodes referred to as elementary parity-check nodes or ECN, each elementary parity-check node receiving two messages U and V as input and generating one message E as output.

Figure 2C:
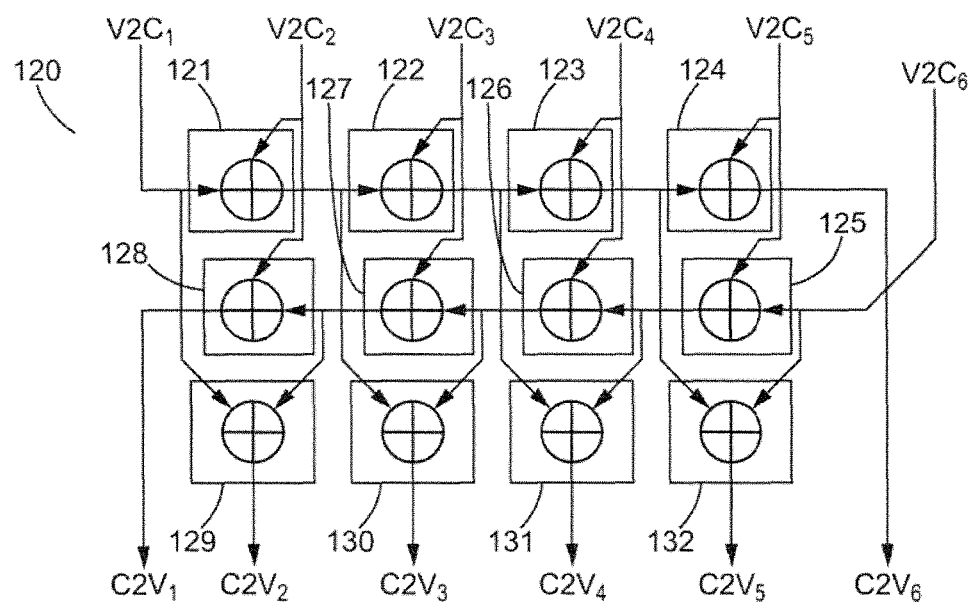

FIG. 2c shows an example architecture of a parity-check node processor (120) of degree $d_c$ equal to 6, comprising 12 elementary parity-check nodes (121-132). The parity-check node processor (120) receives six messages $V2C_i$, i=1 . . . 6 in parallel and generates six output messages $C2V_i$, i= 1 . . . 6.

Each elementary parity-check node performs a parity-check test on its input messages U and V in order to generate an output message representing the combinations of input messages having the best likelihood. For example, in the case where the likelihood is represented by an LLR value as defined above, the output message E from an elementary parity-check node is obtained by the following relation:

$$E(x)=\min_{x_u \in GF(q), x_v \in GF(q)} \{U(x_u)+V(x_v)\}_{x_u \oplus x_v = x} \quad (Eq.\ 1)$$

Figure 3A:
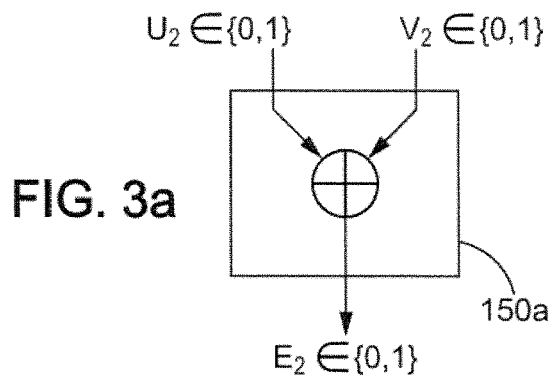
FIGS. 3a, 3b and 3c show an elementary parity-check node where the invention can be applied.

FIG. 3a illustrates a parity-check node (150a) of a binary decoder. The parity-check node receives two input messages, and generates one output message which is the sum of the values from the input message. For simplicity, we do not consider the likelihood values here. The input messages (or variables), denoted $U_2$ and $V_2$, and the output message (or variable), denoted $E_2$, are values in GF(2), illustrated in the figure by the pair of values {0,1}. The two input combinations (0,0) and (1,1) produce the output value "0", in accordance with the conventional law of addition in GF(2), while the two input combinations (0,1) and (1,0) produce the output value "1".

Figure 3B:
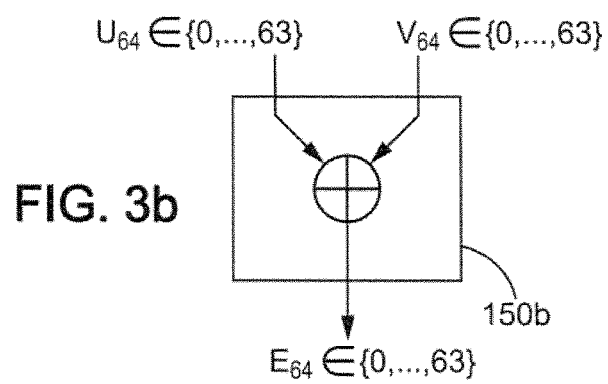

FIG. 3b illustrates an elementary parity-check node (150b) of a non-binary decoder in which the input data and output data are values in the Galois field GF(64). The input variables, denoted $U_{64}$ and $V_{64}$, and the output variable, denoted $E_{64}$, are values in a Galois field of order 64 (denoted GF(64)), illustrated in the figure by the set of values {0,1, . . . , 63}. As the output variable has values in GF(64), there are 64 valid input combinations for each of the 64 output values determined according to the chosen law of addition in GF(64).

The above can be generalized to an elementary parity-check node of a non-binary decoder in which the two input variables $U_q$ and $V_q$ and the output variable $E_q$ are values in a Galois field of order q, denoted GF(q). For each of the q possible values of the output variable $E_q$, determined according to the law of addition chosen in GF(q), there are q combinations of input variables $U_q$ and $V_q$.

Figure 3C:
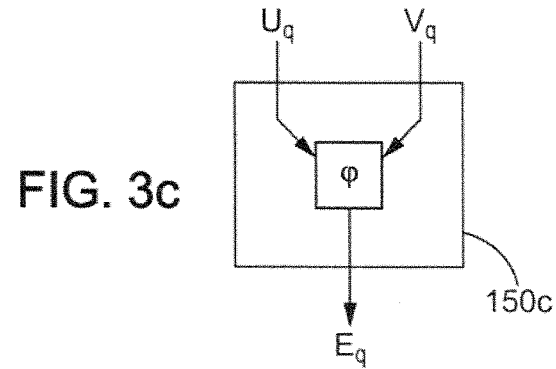

The operation performed within the elementary parity-check node is not limited to addition. FIG. 3c illustrates an elementary parity-check node (150c) for which the two input variables $U_q$ and $V_q$ and the output variable $E_q$ are values in a Galois field of order q, denoted GF(q). The output variable is linked to the input values by a parity-check relation, denoted φ, such that we have $E_q=\varphi(U_q,V_q)$.

With reference to FIGS. 2b and 2c, the parity-check node processor (110), (120) receives in parallel $d_c$ input messages $V2C_i$, i=1 . . . $d_c$, applies to these input variables a parity-check test corresponding to Equation 1 provided above, and generates $d_c$ output messages $C2V_i$, i=1 . . . $d_c$ respectively sent to the corresponding variable node processors $VN_i$, i= 1 . . . $d_c$ (111), (112), and (113). As shown in FIG. 3c, the processing of input messages within the processor (110) can be broken down into three layers of processing each comprising $d_c$−2 elementary parity-check nodes (121-132).

Each elementary parity-check node (121-132) receives two messages U and V each containing q pairs (symbol with values in GF(q), likelihood value associated with the symbol) and generates an output message E containing the q best combinations of values of the two input messages U and V, meaning those having the highest likelihood. In one embodiment, the message E is defined by Equation 1 above. This equation corresponds to extracting q minimum values in the matrix of sum values, denoted $T_\Sigma$, defined by $T_\Sigma[i, j]=U[i]+V[j]$ for (i; j)∈{0, . . . , q−1}$^2$. The lowest sums of the log-likelihood values identify the components in GF(q) having the highest likelihood.

The Extended Min Sum algorithm (EMS) recommends limiting the search for these minimum values to the $n_m$ best symbols in the messages arriving at an elementary parity-check node for calculating the values of the output message, with $n_m \ll q$. One can then consider representing the input and output messages with vectors of size $n_m$ respectively denoted U[k], V[k], and E[k]. In one embodiment, the values of the output message can be obtained by selecting the $n_m$ smallest values among the $n_m^2$ sums of the $n_m$ values of the first input message and the $n_m$ values of the second input message.

This step of selecting $n_m$ values among those calculated from the values of the input messages can be illustrated by a table representing the matrix $T_\Sigma$, of size $n_m \times n_m$, in which the elements $T_\Sigma[i, j]$ are determined by the sum of the values U[i] and V[j] of the input messages: $T_\Sigma[i, j]=U[i]+V[j]$ for (i; j)∈{0, . . . , $n_m$−1}$^2$. In addition, the reliability values of the input messages U and V are in decreasing order of reliability, the value U[0] (respectively V[0]) corresponding to the best reliability and the value U[$n_m$] (respectively V[$n_m$]) to the worst. When the reliability values correspond to log-likelihood ratios LLR, these values are therefore in decreasing order, with the lowest LLR value representing the highest reliability.

In this case, the EMS algorithm for updating the elementary parity-check nodes provides an iterative method for exploring candidates of the matrix $T_\Sigma$ in order to select the $n_m$ smallest output values and thereby determine the values of the vector E[k] corresponding to the output message from the node.

This EMS algorithm comprises a first initialization step consisting of introducing the values from the first column of $T_\Sigma$ into a sorter of size $n_m$. The smallest value in the sorter is then calculated and copied into the output vector E[k]. The value extracted from the sorter and copied into the output vector is then replaced by its right neighbor in the matrix $T_\Sigma$, which is introduced into the sorter. A new iteration of the process is then carried out, calculating the smallest value in the sorter.

To illustrate the principles of the EMS algorithm with an example, consider the example of two input vectors $U_{64}$ and $V_{64}$ of size $n_m$=8. This assumes that the eight components having the best likelihood values among the 64 components corresponding to the possible values of a symbol of each input message with values in GF(64) were extracted in a preliminary step. It is further assumed that these eight best LLRs for $U_{64}$ and $V_{64}$ are given by: $U_{64}$=(0,1,2,3,3,4,5,5) and $V_{64}$=(0,0,1,2,4,4,5,6). The following table shows the 64 candidates determined based on vectors $U_{64}$ and $V_{64}$:

|     | (0) | (1) | (2) | (3) | (3) | (4) | (5) | (5) |
|-----|-----|-----|-----|-----|-----|-----|-----|-----|
| (0) | 0   | 1   | 2   | 3   | 3   | 4   | 5   | 5   |
| (0) | 0   | 1   | 2   | 3   | 3   | 4   | 5   | 5   |
| (1) | 1   | 2   | 3   | 4   | 4   | 5   | 6   | 6   |
| (2) | 2   | 3   | 4   | 5   | 5   | 6   | 7   | 7   |
| (4) | 4   | 5   | 6   | 7   | 7   | 8   | 9   | 9   |
| (4) | 4   | 5   | 6   | 7   | 7   | 8   | 9   | 9   |
| (5) | 5   | 6   | 7   | 8   | 8   | 9   | 10  | 10  |
| (6) | 6   | 7   | 8   | 9   | 9   | 10  | 11  | 11  |

The EMS algorithm for updating elementary parity-check nodes is described below for the above exemplary $U_{64}$ and $V_{64}$, selecting 8 as the value for $n_m$.

The implementation of this algorithm can use a sorter, meaning a set of $n_m$ memory registers in which are stored the $n_m$ candidates constituting a selection set S from which a candidate is selected, removed from the sorter, then replaced by another candidate in each iterative cycle of the algorithm.

The initialization phase consists of selecting the values in the first column of $T_\Sigma$, as indicated above and as illustrated in the following table:

|     | (0) | (1) | (2) | (3) | (3) | (4) | (5) | (5) |
|-----|-----|-----|-----|-----|-----|-----|-----|-----|
| (0) | 0   | 1   | 2   | 3   | 3   | 4   | 5   | 5   |
| (0) | 0   | 1   | 2   | 3   | 3   | 4   | 5   | 5   |
| (1) | 1   | 2   | 3   | 4   | 4   | 5   | 6   | 6   |
| (2) | 2   | 3   | 4   | 5   | 5   | 6   | 7   | 7   |
| (4) | 4   | 5   | 6   | 7   | 7   | 8   | 9   | 9   |
| (4) | 4   | 5   | 6   | 7   | 7   | 8   | 9   | 9   |
| (5) | 5   | 6   | 7   | 8   | 8   | 9   | 10  | 10  |
| (6) | 6   | 7   | 8   | 9   | 9   | 10  | 11  | 11  |

In this manner, the initial elements are determined of the selection set S of size $n_m$ with elements $\{T_\Sigma(0, j)|j=0, \ldots, n_m-1\}$. In a variant which reduces the calculations required, the values of $T_\Sigma$ are not calculated beforehand, and this initialization phase includes determining each of the elements $\{T_\Sigma(0,j)|j=0, \ldots, n_m-1\}$ and placing them in memory in the sorter. It therefore uses $n_m$ calculation cycles.

After this initialization phase, the $n_m$ registers of the sorter which contain the selection values thus contain the values calculated for the first column of $T_\Sigma$:

Sorter = | 0 | 0 | 1 | 2 | 4 | 4 | 5 | 6 |

A first iteration of the calculation loop is then initiated by extracting the smallest element of the set S, then replacing it in this selection set with the smallest element in the row of matrix $T_\Sigma$ where the extracted element is located. In the example being considered, for this first iteration we thus extract element $T_\Sigma(0,0)$ and replace it with element $T_\Sigma(0,1)$ which is calculated, if this calculation has not already been done. The set S is therefore updated and becomes S=$\{T_\Sigma(1, 0); T_\Sigma(0, j)$ for j=1; ... ; $n_m-1\}$=$\{1; 0; 1; 2; 4; 4; 5; 6\}$. We also have $E[0]=T_\Sigma(0,0)$, that is, E=$(T_\Sigma(0,0);×;×;×;×;×;×; ×)$.

The algorithm loops and executes a second iteration of extraction and replacement in the set S. The extracted element is $T_\Sigma(0,1)$, which is replaced by $T_\Sigma(1,1)$. S is updated and becomes $\{T_\Sigma(1,0); T_\Sigma(1,1); T_\Sigma(0, j)$ for j= 2; . . . ; $n_m-1\}$=$\{1; 1; 1; 2; 4; 4; 5; 6\}$. We also have $E[1]=T_\Sigma(0,1)$, that is, E=$(T_\Sigma(0,0); T_\Sigma(0,1);×;×;×;×;×;×)$.

During a third iteration of extraction and replacement in the set S, element $T_\Sigma(1,0)$ is extracted from S, and is replaced by $T_\Sigma(2,0)$. S becomes $\{T_\Sigma(2, 0); T_\Sigma(1,1); T_\Sigma(0, j)$ for j=2; . . . ; $n_m-1\}$=$\{2; 1; 1; 2; 4; 4; 5; 6\}$. We also have $E[2]=T_\Sigma(1,0)$, that is, E=$(T_\Sigma(0,0); T_\Sigma(0,1); T_\Sigma(1, 0);×;×;×;×;×)$.

During a fourth iteration of extraction and replacement in the set S, element $T_\Sigma(1,1)$ is extracted from S, and is replaced by $T_\Sigma(2,1)$. S becomes $\{T_\Sigma(2,0); T_\Sigma(2,1); T_\Sigma(0, j)$ for j=2; . . . ; $n_m-1\}$=$\{2; 2; 1; 2; 4; 4; 5; 6\}$. We also have $E[3]=T_\Sigma(1,1)$, that is, E=$(T_\Sigma(0,0); T_\Sigma(0,1); T_\Sigma(1,0); T_\Sigma(1, 1);×;×;×;×)$. During a fifth iteration of extraction and replacement in the set S, element $T_\Sigma(0,2)$ is extracted from S, and is replaced by $T_\Sigma(1,2)$. S becomes $\{T_\Sigma(2,0); T_\Sigma(2,1); T_\Sigma(1,2); T_\Sigma(0, j)$ for j=3; . . . ; $n_m-1\}$=$\{2; 2; 2; 2; 4; 4; 5; 6\}$. We also have $E[4]=T_\Sigma(0,2)$, that is, E=$(T_\Sigma(0,0); T_\Sigma(0,1); T_\Sigma(1,0); T_\Sigma(1,1); T_\Sigma(0,2);×;×;×)$.

During a sixth iteration of extraction and replacement in the set S, element $T_\Sigma(2,0)$ is extracted from S, and is replaced by $T_\Sigma(3,0)$. S becomes $\{T_\Sigma(3, 0); T_\Sigma(2,1); T_\Sigma(1,2); T_\Sigma(0, j)$ for j=3; . . . ; $n_m-1\}$=$\{3; 2; 2; 2; 4; 4; 5; 6\}$. We also have $E[5]=T_\Sigma(2,0)$, that is, E=$(T_\Sigma(0,0); T_\Sigma(0,1); T_\Sigma(1,0); T_\Sigma(1,1); T_\Sigma(0,2); T_\Sigma(2,0);×;×)$.

During a seventh iteration of extraction and replacement in the set S, element $T_\Sigma(2,1)$ is extracted from S, and is replaced by $T_\Sigma(3,1)$. S becomes $\{T_\Sigma(3,0); T_\Sigma(3, 1); T_\Sigma(1,2); T_\Sigma(0, j)$ for j=3; . . . ; $n_m-1\}$=$\{3; 3; 2; 2; 4; 4; 5; 6\}$. We also have $E[6]=T_\Sigma(2,1)$, that is, E=$(T_\Sigma(0,0); T_\Sigma(0,1); T_\Sigma(1,0); T_\Sigma(1,1); T_\Sigma(0,2); T_\Sigma(2,0); T_\Sigma(2,1);×)$.

The search ends with the extraction of an $n_m$-th value in the set S, the extracted value being selected in the same manner as above as being the smallest value in the set S. Element $T_\Sigma(1,2)$ is thus extracted from S, and we have $E[7]=T_\Sigma(1,2)$ that is, E=$(T_\Sigma(0,0); T_\Sigma(0,1); T_\Sigma(1,0); T_\Sigma(1,1); T_\Sigma(0,2); T_\Sigma(2,0); T_\Sigma(2,1); T_\Sigma(1,2))$.

The resulting vector of size $n_m$ is thus determined after $n_m$ iterations of the search cycle and $2 \times n_m$ calculation cycles.

The Bubble-Check algorithm reduces the complexity of the calculations for updating the elementary parity-check nodes, in comparison to the EMS algorithm. It makes use of the following properties of the elements in the matrix $T_\Sigma$, in the case where the input lists are ordered by increasing LLR value:

$\forall j \in [1, n_m]$ and $i<i'$, then $T_\Sigma(i, j) \leq T_\Sigma(i', j)$ and $\forall i \in [1, n_m]$ and $j<j'$, then $T_\Sigma(i, j) \leq T_\Sigma(i, j')$ to draw the following three main conclusions:
- It is possible to initially exclude a subset of elements of the matrix $T_\Sigma$, which means excluding a portion of the exploration area of this matrix;
- The size of the selection set S can be reduced, for example by a factor of 2;
- Predefined paths for selecting replacements for each element of the initial set S (called "bubbles") can be determined.

Figure 4:
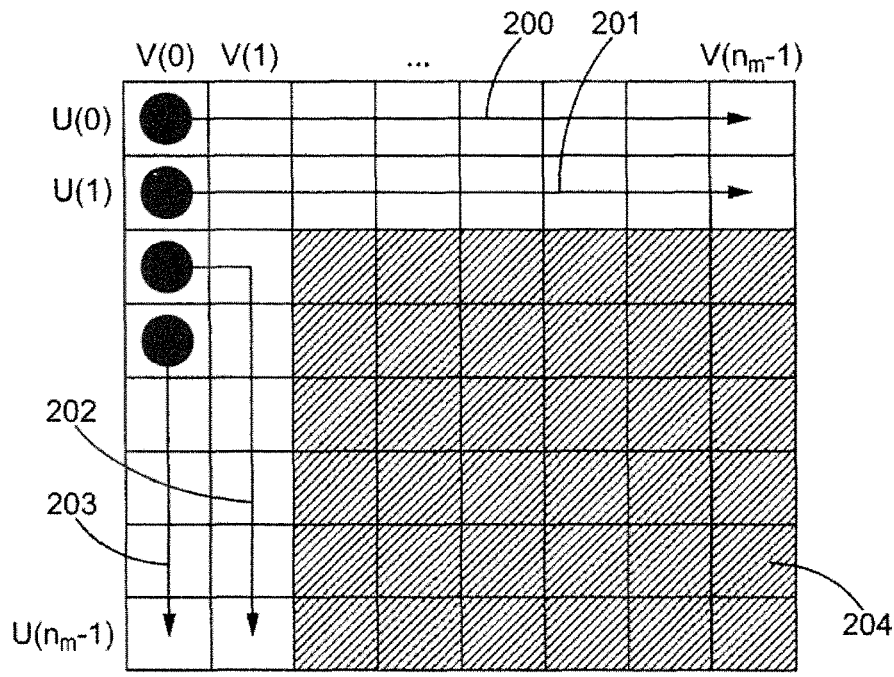
FIG. 4 is a table representing certain aspects of the calculations performed within an elementary parity-check node according to the L-Bubble Check algorithm.

The L-Bubble Check algorithm improves the Bubble Check algorithm by defining four "bubble" paths limited to the first two rows and first two columns of the matrix, as illustrated in FIG. 4. This limits the search space for the minimums to $3 \times n_m$ combinations.

To reuse the above example, we thus consider a selection set S' of size $$n'_m = \frac{n_m}{2} = 4.$$

The subset Excl of elements of matrix $T_\Sigma$ defined by Excl=$\{T_\Sigma(i; j)$ for $(i; j)=\{2, \ldots, n_m-1\}^2\}$ is excluded from the exploration area of matrix $T_\Sigma$, meaning that it is determined before any elements of this area are a candidate for inclusion in the selection set S.

The initialization phase of the EMS algorithm is again applied, but with this selection set that is half as large. A selection set S' of size $n_m/2$ is thus formed by calculating elements $\{T_\Sigma(i, 0)|i=0, \ldots, n'_m-1\}$.

The initialization phase consists of selecting the $n'_m$ values from the first column of $T_\Sigma$, as indicated above and as illustrated in the following table:

|     | (0) | (1) | (2) | (3) | (3) | (4) | (5) | (5) |
|-----|-----|-----|-----|-----|-----|-----|-----|-----|
| (0) | 0   | 1   | 2   | 3   | 3   | 4   | 5   | 5   |
| (0) | 0   | 1   | 2   | 3   | 3   | 4   | 5   | 5   |
| (1) | 1   | 2   | 3   | 4   | 4   | 5   | 6   | 6   |
| (2) | 2   | 3   | 4   | 5   | 5   | 6   | 7   | 7   |
| (4) | 4   | 5   | 6   | 7   | 7   | 8   | 9   | 9   |
| (4) | 4   | 5   | 6   | 7   | 7   | 8   | 9   | 9   |
| (5) | 5   | 6   | 7   | 8   | 8   | 9   | 10  | 10  |
| (6) | 6   | 7   | 8   | 9   | 9   | 10  | 11  | 11  |

These $n'_m$ values constitute the "bubbles" of the L-Bubble-Check algorithm.

In the above example, the set S' is therefore initialized to S'=$\{0; 0; 1; 2\}$.

The subset Excl of elements of matrix $T_\Sigma$ defined by Excl=$\{T(i;j)$ for $(i; j)=\{2, \ldots, n_m-1\}^2\}$ (204) is excluded from the examined area of matrix $T_\Sigma$, and $n'_m=4$ paths $(P_l)_{l=0, \ldots, n'_m-1}$ (200, 201, 202, 203) are predefined for replacement after extraction of the elements of S', the first element of each predefined path respectively corresponding to the four elements of the initial set S'.

With reference to FIG. 4, the first element $T_\Sigma(0,0)$ of the initial set S is also the first element of a horizontal path (200) defined by subset $P_0=\{T_\Sigma(0; j)$ for $j=\{0, \ldots, n_m-1\}\}$, the second element $T_\Sigma(1,0)$ of the initial set S is also the first element of a horizontal path (201) defined by subset $P_1=\{T_\Sigma(1; j)$ for $j=\{0, \ldots, n_m-1\}\}$, the third element $T_\Sigma(2,0)$ of the initial set S is also the first element of a path (202) defined by subset $P_2=\{T_\Sigma(2; 0)\cup T_\Sigma(i; 1)$ for $i=\{2, \ldots, n_m-1\}\}$, and the fourth element $T_\Sigma(3,0)$ of the initial set S is also the first element of a vertical path (203) defined by subset $P_3=\{T_\Sigma(i; 0)$ for $i=\{n'_m-1, \ldots, n_m-1\}\}$.

One will note that the four paths $(P_l)_{l=0, \ldots, n'_m-1}$ (200, 201, 202, 203) illustrated in FIG. 4 are defined within the non-excluded path area, the excluded area (204) corresponding to subset Excl=$\{T_\Sigma(i; j)$ for $(i; j)=\{2, \ldots, 8\}^2\}$.

A first iteration of the calculation loop is then initiated, extracting the smallest element of the set S' then replacing it in this selection set with the closest neighbor of the extracted element in the path $(P_l)_{l=0, \ldots, n'_m-1}$ of matrix $T_\Sigma$ corresponding to the extracted element. To do this, one can, for example, calculate the address of the replacing element in the set S' along the predefined path corresponding to the element extracted from S', calculate the value of the replacing element according to its address, then update the set S' with the replacing element.

In the example considered, for this first iteration the element $T_\Sigma(0,0)$ is extracted, the address of the replacing element is calculated along path $P_0=\{T_\Sigma(0;j)$ for $j=\{0, \ldots, n_m-1\}\}$, which leads to the address of element $T_\Sigma(0,1)$ which is then calculated. The set S' is then updated and becomes S'=$\{T_\Sigma(0, 1); T_\Sigma(i, 0)$ for $i=1; \ldots; n'_m-1\}=\{1; 0; 1; 2\}$. We also have C[0]=$T_\Sigma(0,0)$, which is C=$(T_\Sigma(0, 0);\times;\times;\times;\times;\times;\times;\times)=(0;\times;\times;\times;\times;\times;\times;\times)$.

The algorithm loops and executes a second iteration of extraction and replacement in the set S'. A smaller element is extracted from the set S', and in the example being considered the extracted element is $T_\Sigma(1,0)$. The path corresponding to this element is $P_1=\{T_\Sigma(1; j)$ for $j=\{0, \ldots, n_m-1\}\}$. The address of the element neighboring the extracted element $T_\Sigma(1,0)$ along this path is therefore calculated, which leads to element $T_\Sigma(1,1)$ which is then calculated. S' is updated with the calculated value and becomes $\{T_\Sigma(0,1); T_\Sigma(1,1); T_\Sigma(i, 0)$ for $i=2; \ldots; n'_m-1\}=\{1; 1; 1; 2\}$. We also have C[1]=$T_\Sigma(1,0)$, which is C=$(T_\Sigma(0,0); T_\Sigma(1,0);\times;\times;\times;\times;\times;\times)=(0; 0;\times;\times;\times;\times;\times;\times)$.

During a third iteration of extraction and replacement in the set S', element $T_\Sigma(0,1)$ is extracted from S'. The path corresponding to this element is $P_0=\{T_\Sigma(0; j)$ for $j=\{0, \ldots, n_m-1\}\}$. The address of the element neighboring the extracted element $T_\Sigma(0,1)$ along this path is therefore calculated, which leads to element $T_\Sigma(0,2)$ which is then calculated. S' becomes $\{T_\Sigma(0, 2); T_\Sigma(1,1); T_\Sigma(i, 0)$ for $i=2; \ldots; n'_m-1\}=\{2; 1; 1; 2\}$. We also have C[2]=$T_\Sigma(0,1)$, which is=$(T_\Sigma(0,0); T_\Sigma(1,0); T_\Sigma(0,1);\times;\times;\times;\times;\times)=(0; 0; 1;\times;\times;\times;\times;\times)$.

During a fourth iteration of extraction and replacement in the set S', element $T_\Sigma(1,1)$ is extracted from S'. The path corresponding to this element is $P_1=\{T_\Sigma(1; j)$ for $j=\{0, \ldots, n_m-1\}\}$. The address of the element neighboring the extracted element $T_\Sigma(1,1)$ along this path is therefore calculated, which leads to element $T_\Sigma(1,2)$ which is then calculated. S' becomes $\{T_\Sigma(0,2); T_\Sigma(1, 2); T_\Sigma(i, 0)$ for $i=2; \ldots; n'_m-1\}=\{2; 2; 1; 2\}$. We also have C[3]=$T_\Sigma(1,1)$, which is C=$(T_\Sigma(0,0); T_\Sigma(0,1); T_\Sigma(1,0); T_\Sigma(1,1);\times;\times;\times;\times)=(0; 0; 1; 1;\times;\times;\times;\times)$.

During a fifth iteration of extraction and replacement in the set S', element $T_\Sigma(2,0)$ is extracted from S'. The path corresponding to this element is $P_2=\{T_\Sigma(2; 0)\cup T\Sigma i;1$ for $i=2, \ldots, nm-1\}$. The address of the element neighboring the extracted element $T_\Sigma(2,0)$ along this path is therefore calculated, which leads to element $T_\Sigma(2,1)$ which is then calculated. S' becomes $\{T_\Sigma(0,2); T_\Sigma(1,2); T_\Sigma(2, 1); T_\Sigma(i, 0)$ for $i=3; \ldots; n'_m-1\}=\{2; 2; 2; 2\}$. We also have C[4]=$T_\Sigma(2,0)$, which is C=$(T_\Sigma(0,0); T_\Sigma(0,1); T_\Sigma(1,0); T_\Sigma(1,1); T_\Sigma(2, 0);\times;\times;\times)=(0; 0; 1; 1; 1;\times;\times;\times)$.

During a sixth iteration of extraction and replacement in the set S', element $T_\Sigma(0,2)$ is extracted from S'. The path corresponding to this element is once again $P_0=\{T_\Sigma(0; j)$ for $j=\{0, \ldots, n_m-1\}\}$. The address of the element neighboring the extracted element $T_\Sigma(0,2)$ along this path is therefore calculated, which leads to element $T_\Sigma(0,3)$ which is then calculated. S' becomes $\{T_\Sigma(0, 3); T_\Sigma(1,2); T_\Sigma(2,1); T_\Sigma(i, 0)$ for $i=3; \ldots; n'_m-1\}=\{3; 2; 2; 2\}$. We also have C[5]=$T_\Sigma(0,2)$, which is C=$(T_\Sigma(0,0); T_\Sigma(0,1); T_\Sigma(1,0); T_\Sigma(1,1); T_\Sigma(2, 0); T_\Sigma(0,2);\times;\times)=(0; 0; 1; 1; 1; 2;\times;\times)$.

During a seventh iteration of extraction and replacement in the set S', element $T_\Sigma(1,2)$ is extracted from S'. The path corresponding to this element is once again $P_1=\{T_\Sigma(1; j)$ for $j=\{0, \ldots, n_m-1\}\}$. The address of the element neighboring the extracted element $T_\Sigma(1,2)$ along this path is therefore calculated, which leads to element $T_\Sigma(1,3)$ which is then calculated. S' becomes $\{T_\Sigma(0,3); T_\Sigma(1, 3); T_\Sigma(2,1); T_\Sigma(i, 0)$ for $i=3; \ldots; n'_m-1\}=\{3; 3; 2; 2\}$. We also have C[6]=$T_\Sigma(1,2)$, which is C=$(T_\Sigma(0,0); T_\Sigma(0,1); T_\Sigma(1,0); T_\Sigma(1,1); T_\Sigma(2, 0); T_\Sigma(0,2); T_\Sigma(1,2);\times)=(0; 0; 1; 1; 1; 2; 2;\times)$.

The search ends with the extraction of an $n_m$-th value in the set S', the extracted value being selected in the same manner as above, as being the smallest value in the set S'. Element $T_\Sigma(2,1)$ is thus extracted from S', and we have $C[7]=T_\Sigma(2,1)$, which is $C=(T_\Sigma(0,0); T_\Sigma(0,1); T_\Sigma(1,0); T_\Sigma(1,1); T_\Sigma(2,0); T_\Sigma(0,2); T_\Sigma(1,2); T_\Sigma(2,1))=(0; 0; 1; 1; 1; 2; 2; 2)$.

The resulting vector of size $n_m$ is thus determined after $n_m$ iterations of the search cycle and $2 \times n_m$ calculation cycles.

Figure 5A:
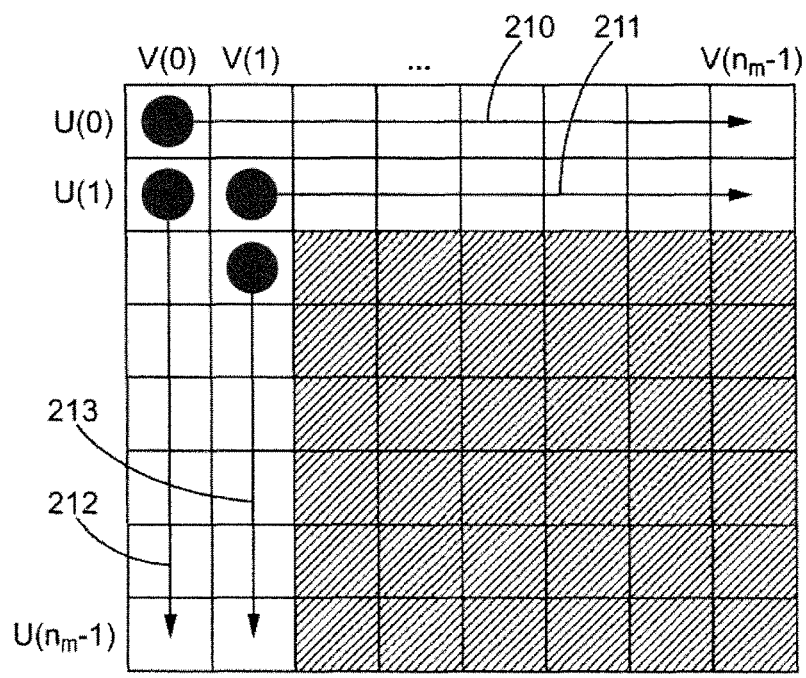
FIGS. 5a and 5b are tables representing certain aspects of the calculations performed within an elementary parity-check node according to a particular embodiment of the proposed method.

FIG. 5a illustrates an example of implementing the proposed algorithm on the same matrix as the one in FIG. 4.

In one embodiment, the proposed method defines an exclusion area for the matrix exploration path, a selection set S" of size $4 \times n_m - 4$, and a matrix exploration path for each of the elements of the selection set.

Consider the case of an elementary parity-check node of a non-binary LDPC decoder, which receives two messages U and V as input and generates a message E as output. The symbols of the codewords as well as the non-zero values of the check matrix of the LDPC decoder belong to the Galois field GF (q), and each input message contains $n_m$ (symbol, reliability) pairs. As described above, the reliability associated with a symbol in a message is represented by a log-likelihood ratio LLR of positive values. The elements of each input message are also ordered by their likelihood value, for example in increasing order with the first element corresponding to the most likely symbol.

We thus have two input messages U and V, with $U=[U(0), \ldots, U(n_m-1)]$ and $V=[V(0), \ldots, V(n_m-1)]$ where $U(i)$ and $V(i)$ are pairs $U(i)=(U_{GF}^i, U_{LLR}^i)$ and $V(i)=(V_{GF}^i, V_{LLR}^i)$ with $U_{GF}^i \in GF(q)$, $V_{GF}^i \in GF(q)$, and $U_{LLR}^i$ and $V_{LLR}^i$ are the normalized LLRs respectively associated with the symbols $U_{GF}^i$ and $V_{GF}^i$. The values $U_{LLR}^i$ and $V_{LLR}^i$ respectively satisfy: $U_{LLR}^0=0$ and $U_{LLR}^i \geq 0$, $i=1, \ldots, n_m$; and $V_{LLR}^0=0$ and $V_{LLR}^i \geq 0$, $i=1, \ldots, n_m$.

In this embodiment, the parameter $n_m$ is chosen to be less than the order q of the Galois field concerned. It is preferably chosen to be much less than this order ($n_m \ll q$), in particular to satisfy the complexity constraints of decoding calculations.

The search for values satisfying the parity-check equation Eq. 1 provided above is limited to the $n_m$ best symbols in the incoming messages, in order to generate an output message in the form of a vector E of size $n_m$. Here again we consider a selection set, denoted $\tilde{S}$, of size $$\widetilde{n_m} \geq \frac{n_m}{2}$$

in the case where $n_m$ is even, and $$\widetilde{n_m} \geq \frac{n_m + 1}{2}$$

otherwise. It is possible, for example, to choose $n_m$ to be even (for example equal to 8 when q is equal to 64), and $\widetilde{n_m}$ equal to $$\frac{n_m}{2}$$

to minimize the memory occupied by the selection set $\tilde{S}$. The subset $\widetilde{Excl}$ of elements of the matrix $T_\Sigma$ defined by $$\widetilde{Excl} = \left\{ T_\Sigma(i, j) \text{ for } (i, j) = \left\{ \frac{\widetilde{n_m}}{2}, \ldots, n_m - 1 \right\}^2 \right\}$$

is excluded from the exploration area of the matrix $T_\Sigma$, meaning that it is determined before any of the elements in this set are a candidate for inclusion in the selection set $\tilde{S}$.

The definition of this exclusion area allows making the paths defined for the elements of the selection set as short as possible, given that these paths are defined outside this exclusion area. These paths must each cover elements of the matrix $T_\Sigma$ that do not belong to the subset of excluded elements $\widetilde{Excl}$.

In this embodiment, the initial elements of the selection set are chosen such that one-way paths can be defined for each of them.

Figure 5B:
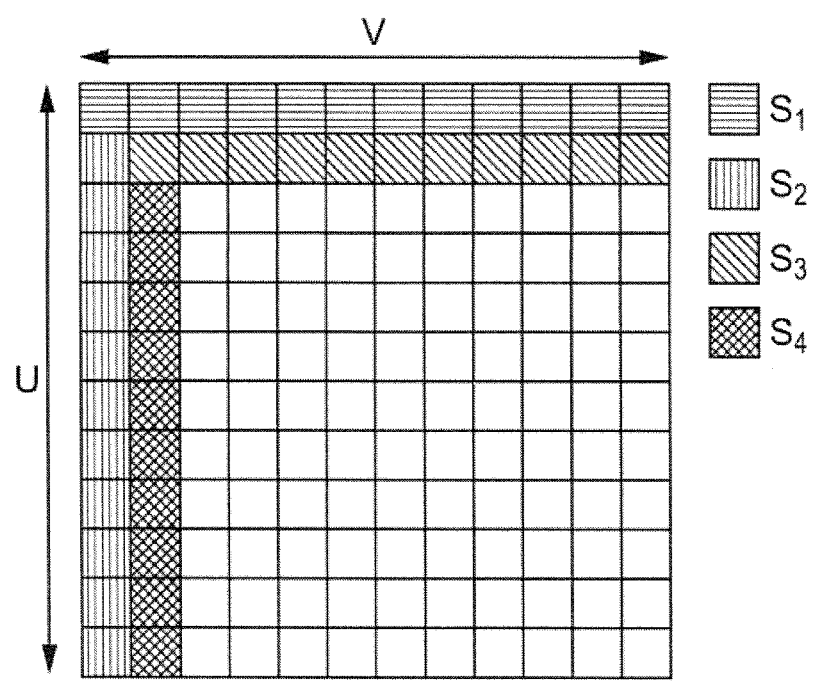

This ensures that the elements of each path are already sorted (either horizontally or vertically), which was not the case in the previous L-Bubble Check example. The exploration area of the matrix $T_\Sigma$ is therefore partitioned into four subspaces S1, S2, S3 and S4, as illustrated in FIG. 5b. Each of these subspaces corresponds to a path illustrated in FIG. 5a. We can see that for four bubbles we will have two horizontal paths (210, 211) and two vertical paths (212, 213). Due to the fact that the values of the LLRs for the input messages are already sorted in increasing order, the elements of these paths, which are either solely horizontal or solely vertical, are also ordered.

We thus define four subsets $(S_k)_{k=1, \ldots, 4}$ of elements of the matrix $T_\Sigma$ which each respectively correspond to an exploration path of the matrix. FIG. 5b illustrates these four subsets in the case of a square matrix $T_\Sigma$ of size 12. In one embodiment, the four subsets $(S_k)_{k=1, \ldots, 4}$ are defined by the following equations:

$$S_1 = [U(0) + V(l); l \in \{0, \ldots, n_m - 1\}]$$

$$S_2 = [V(0) + U(l); l \in \{1, \ldots, n_m - 1\}]$$

$$S_3 = [U(1) + V(l); l \in \{1, \ldots, n_m - 1\}]$$

$$S_4 = [V(1) + U(l); l \in \{2, \ldots, n_m - 1\}]$$

The four exploration paths of the matrix $T_\Sigma$ comprise $4 \times (n_m - 1)$ positions in the matrix.

Figure 6A:
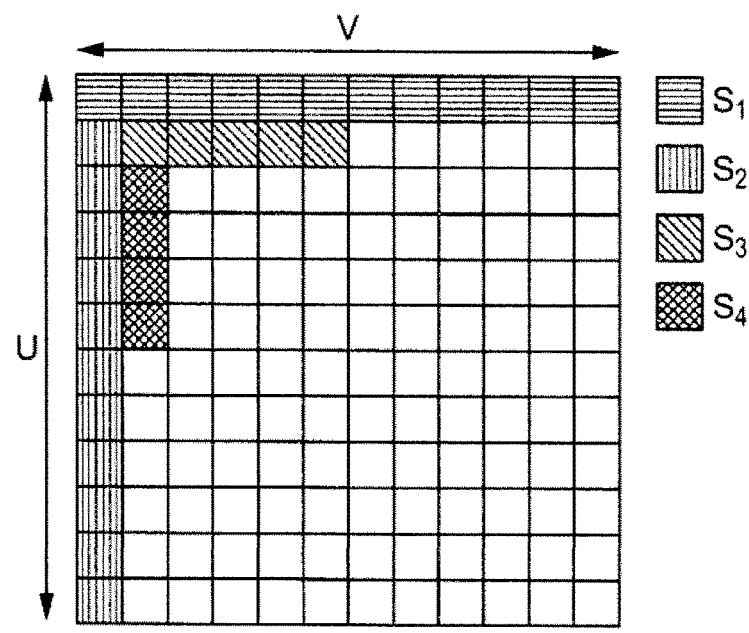
FIGS. 6a and 6b are tables representing certain aspects of the calculations performed within an elementary parity-check node according to a particular embodiment of the proposed method.
Figure 6B:
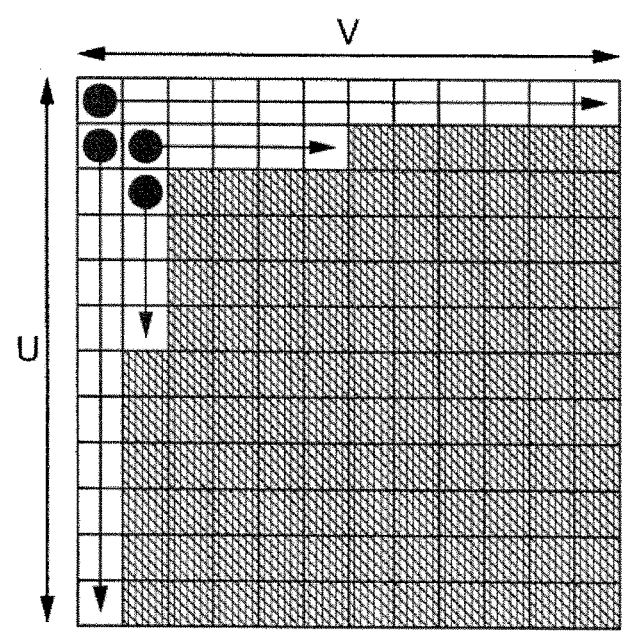

In another embodiment of the proposed method, illustrated by FIGS. 6a and 6b, the four subsets $(S_k)_{k=1, \ldots, 4}$, respectively associated with paths of "bubbles", are defined by the following equations:

$$S_1 = [U(0) + V(l); l \in \{0, \cdots, n_m - 1\}]$$

$$S_2 = [V(0) + U(l); l \in \{1, \cdots, n_m - 1\}]$$

$$S_3 = \left[ U(1) + V(l); l \in \left\{ 1, \cdots, \frac{n_m}{2} - 1 \right\} \right]$$

$$S_4 = \left[ V(1) + U(l); l \in \left\{ 2, \cdots, \frac{n_m}{2} - 1 \right\} \right]$$

The four exploration paths of the matrix $T_\Sigma$ comprise $3 \cdot n_m - 4$ positions in the matrix, further reducing the exploration space.

Figure 7:
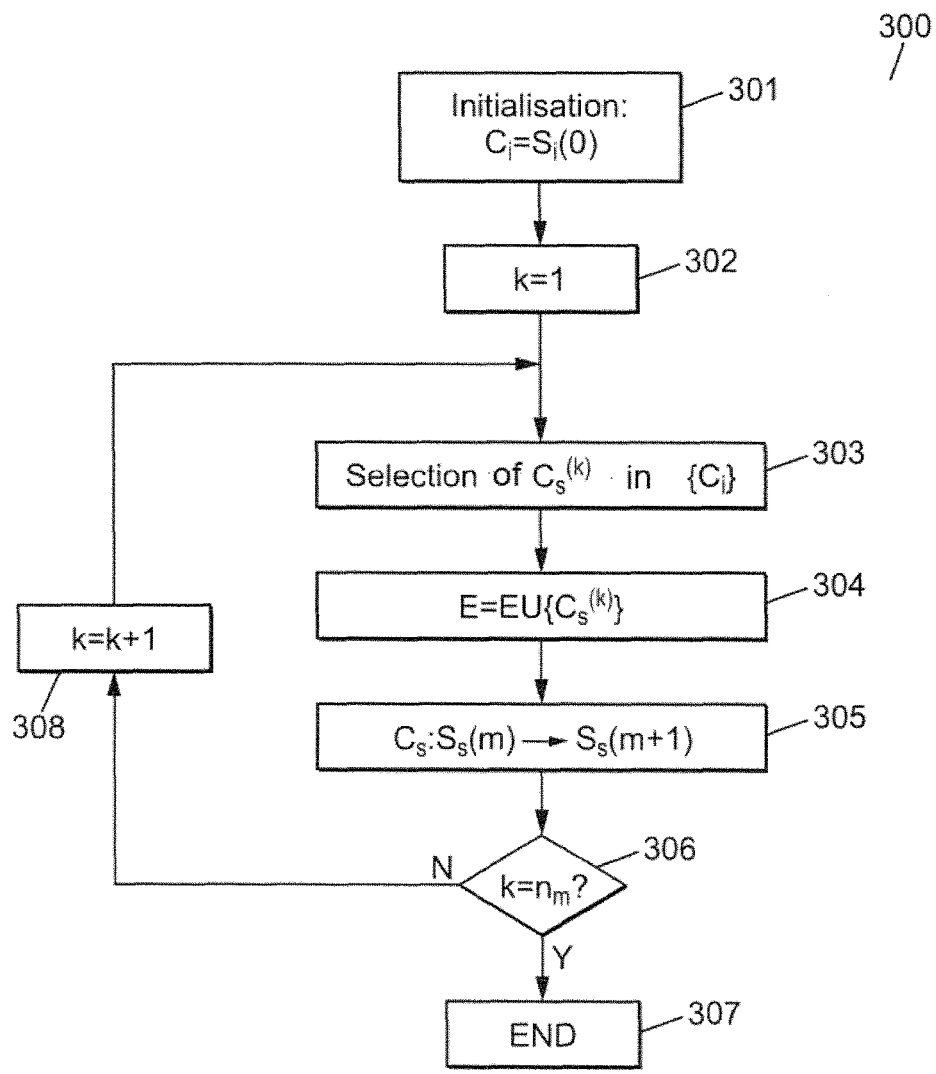
FIG. 7 is a diagram illustrating certain aspects of implementing the proposed method.

FIG. 7 illustrates an algorithm (300) for exploring the matrix $T_\Sigma$ according to one particular embodiment. The candidates for selection after comparison, which using the above terminology are the elements of the selection set, are denoted below as $c_1$, $c_2$, $c_3$, and $c_4$.

The values of the elements of the selection set are initialized (301) to the initial values of the subsets $(S_k)_{k=1,\ldots,4}$, which correspond to the initial elements of the paths which they respectively define: $c_1=S_1(0)$, $c_2=S_2(0)$, $c_3=S_3(0)$, $c_4=S_4(0)$. A set of values E corresponding to the output message is initialized with predetermined values. A loop index k is also initialized, for example to the value 1: k=1.

An iteration of the algorithm is then executed, with selection (303) of a value, denoted $c_s^{(k)}$, from among the values of $c_1$, $c_2$, $c_3$, and $c_4$. As explained above, the elements $c_1$, $c_2$, $c_3$, and $c_4$ can be (symbol, reliability) pairs, in which case the selection is made on the basis of a reliability value criterion. In other words, selecting $c_s^{(k)}$ means selecting the most reliable pair among the pairs in the selection set, which in this example is from among $c_1$, $□_2$, $□_3$, and $□_4$. Different representations of the reliability can be adopted, including log-likelihood ratios LLRs as defined above. In this case, the selection of $□_□^{(□)}$ can consist of selecting the □ associated with the smallest LLR value. As a variant, the elements $□_1$, $□_2$, $□_3$, and $□_4$ manipulated by the algorithm can directly correspond to a reliability value, for example an LLR value.

The output message □ is then updated (304) with the selected value: $□=□\cup\{□_□^{(□)}\}$.

The selection set is then updated (305) by replacing the value of the selected element $□_□$ with the next value in the corresponding subset $□_□$. For example, if the selected pair $□_□^{(□)}$ corresponds to element $□_□(□)$ of the corresponding subset (in other words of the path) $□_□$, this element is replaced in the selection set with the value or the value pair corresponding to $□_□(□+1)$.

The loop index □ of the iteration is then compared (306) to value $□_□$ to check whether or not $□_□$ iterations have been completed. If less than $□_□$ iterations have been completed, the loop index □ is incremented (308) and a new iteration is begun. Otherwise, the algorithm ends (307).

In another embodiment (not represented in FIG. 7), selecting (303) the best reliability value or the pair having the best reliability $□_□^{(□)}$ comprises verifying that the candidate being selected from the set of $\{□_□\}$ is not already in the set of values or pairs previously selected. If $□_□^{(□)}$ is already in the set E, it is not reselected and is set aside and marked as an invalid candidate. Marking a candidate as invalid can be done in various ways. For example, when the algorithm processes (symbol, reliability pairs represented by an LLR), the LLR value of the pair that is to be marked as invalid can be forced to a very low value, for example near or equal to zero.

Forcing the LLR value to 0 ensures that the algorithm generates a sorted output. In other words, because an elementary parity-check node is likely to generate invalid pairs, another elementary parity-check node (for example, with reference to FIG. 2c, a node of a lower layer) receiving these pairs will compare valid pairs with invalid pairs. To simplify the processing, we consider the invalid pairs to be valid when performing the comparison in the algorithm. For example, in a given iteration of the algorithm, if comparing the values respectively corresponding to the values of subsets $□_1(□_1)$, $□_2(□_2)$, $□_3(□_3)$ □□□ $□_4(□_4)$, where $□_3(□_3)$ is an invalid pair and pair $□_2(□_2)$ has the best reliability (for example the smallest LLR value) among the four candidates $□_1(□_1)$, $□_2(□_2)$, $□_3(□_3)$ and $□_4(□_4)$, the node ECN will select and include the pair $□_2(□_2)$ in the output set. However, it is possible that pair $□_3(□_3+1)$ is valid (in the sense that it has not yet ever been selected for inclusion in the output set). If the LLR value of pair $□_3(□_3)$ is not forced to zero, one cannot be sure that the reliability of $□_3(□_3+1)$ is not as good (and therefore has a larger LLR value) as that of $□_2(□_2)$. Forcing the reliability of $□_3(□_3)$ to 0 sets aside the pair $□_3(□_3)$ from the comparison to be made, to compare $□_1(□_1)$, $□_2(□_2)$, $□_3(□_3+1)$ and $□_4(□_4)$, instead of $□_1(□_1)$, $□_2(□_2)$, $□_3(□_3)$ and $□_4(□_4)$.

In another embodiment (not represented in FIG. 7), the updating (305) of the pair or of the selected value is also accompanied by the updating, in the same manner as in the selecting, of any pair or value declared to be invalid, in order to minimize the presence of invalid pairs in the output message from the parity-check node, and this is done even when the invalid pair is not the one selected during the comparison in the current iteration.

Figure 8:
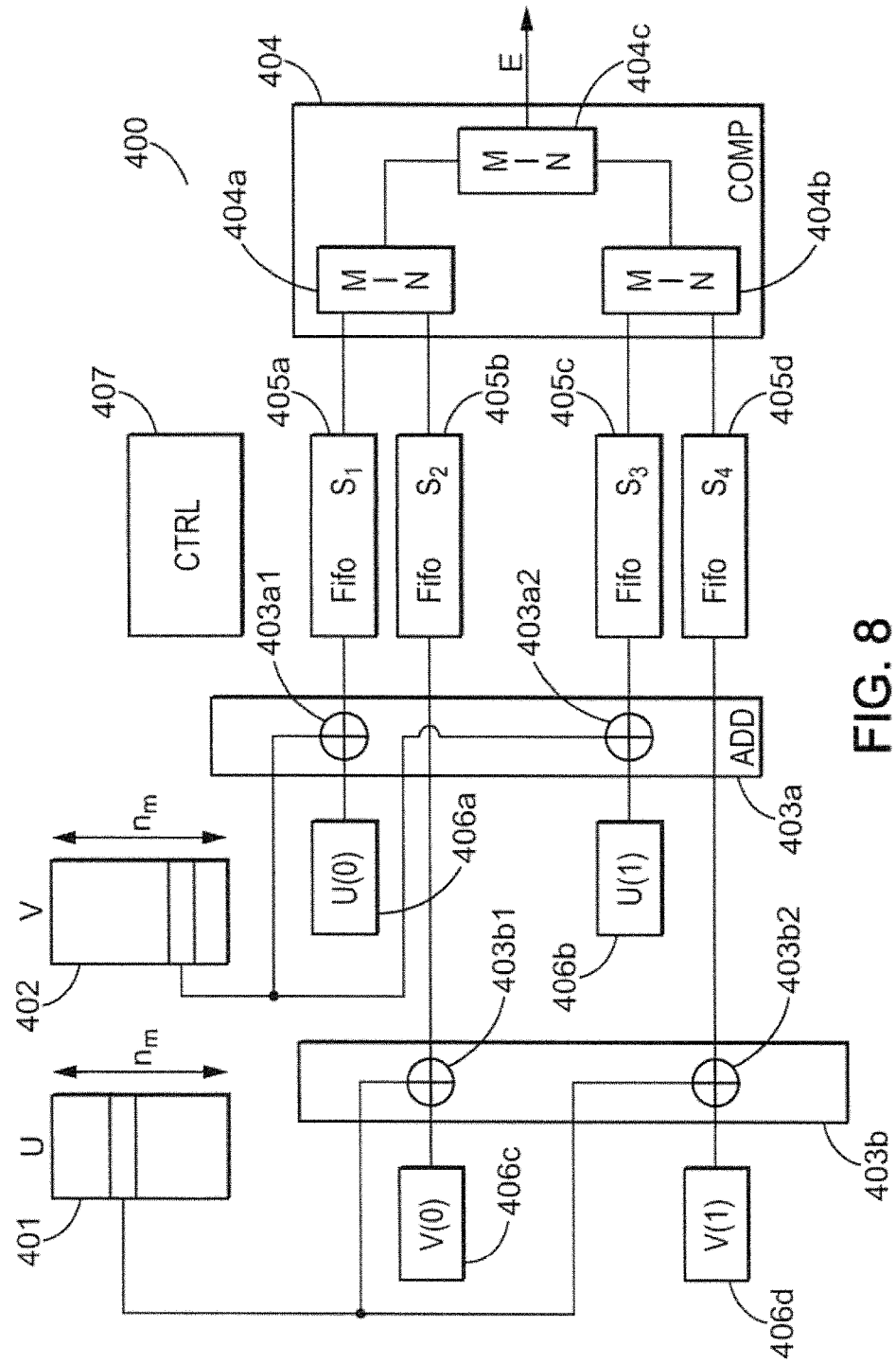
FIG. 8 shows an architecture of an elementary parity-check node for implementing the proposed method.

FIG. 8 shows an example of an elementary parity-check node architecture for implementing the proposed exploration algorithms. This architecture comprises four adders (403a1, 403a2, 403b1, 403b2), four registers (406a, 406b, 406c, 406d), four FIFO memories (405a, 405b, 405c, 405d), and a comparison module (404).

The elements of the input messages U and V are stored in memory means (401, 402), for example RAM memory. The elements of each input message U and V are sorted according to their reliability, by decreasing order of reliability. In the example represented in FIG. 8, the reliability values are expressed by log-likelihood ratios LLRs which are therefore organized in increasing order, with the smallest LLR value representing the greatest reliability. The input messages each contain $□_□$ elements, each element comprising a (symbol, LLR) pair, ordered from the element having the lowest LLR value (for elements □(0) and □(0) respectively) to an element having the highest LLR value (elements $□(□_□)$ and $□(□_□)$ respectively). The registers (406a, 406b, 406c, 406d) respectively store elements U(0), U(1), V(0) and V(1). The elementary parity-check node (400) includes an adder module (403a-403b) configured to calculate: on the one hand, the sums (403a1, 403a2) (within the Galois field GF(q) concerned) of element V(j') originating from memory V (402) and, respectively, of element U(0) stored in the first register (406a), and of element U(1) stored in the second register (406b); and on the other hand the sums (403b1, 403b2) (within the Galois field GF(q) concerned) of element U(i') originating from memory U (401) and, respectively, of element V(0) stored in the third register (406c), and of element V(1) stored in the fourth register (406c). This adder module (403a, 403b) thus allows generating the elements of the four subsets $(□_□)_{□=1,\ldots,4}$ defined above. The outputs from each adder (403a1, 403a2, 403b1, 403b2) of this module are respectively fed to four FIFO (First In, First Out) type memories (for example implemented as RAM configured into four FIFO stacks) (405a, 405b, 405c, 405d), which therefore each implement one of the four subsets $(□_□)_{□=1,\ldots,4}$ defined above: the first FIFO memory (405a), of a size at least equal to $(□_□/2)-1$, will receive values □(0)+□(□') from set $□_1$, the second FIFO memory (405b), of a size at least equal to $(□_□/2)-2$, will receive values □(□')+□(0) from set $□_2$, the third FIFO memory (405c), of a size at least equal to $(□_□/2)-2$, will receive values □(1)+□(□') from set $□_3$, and the fourth FIFO memory (405d), of a size at least equal to $(□_□/2)-3$, will receive values □(□')+□(1) from set $□_4$.

The outputs of the four FIFO memories (405a, 405b, 405c, 405d) are fed to a comparison module (404). In the embodiment shown in the figure, the comparison module comprises three two-way comparators (404a, 404b, 404c): two of the two-way comparators (404a, 404b) respectively selecting the smallest LLR value between the outputs from the first and second FIFO memories (405a, 405b), and between the third and fourth FIFO memories (405c, 405d), and the third comparator (404c) selecting the smallest LLR value between the outputs from the first two. The output values of the node 400 are produced by the third two-way comparator (404c). The elementary parity-check node further comprises a control unit (407) configured to control the reads/writes for the input memories U and V (401, 402) and FIFO memories (405a, 405b, 405c, 405d), the adder module (403a, 403b), and the comparison module (404). The comparison module (404) performs a comparison and generates an element of the output message E in each calculation cycle of the control unit (407), provided that there is at least one element in each FIFO (405a, 405b, 405c, 405d). Thus, in each calculation cycle, the comparison module (404) selects the most reliable symbol among its four inputs and updates the output message E. The FIFO containing the selected symbol is updated so that the comparator (404) receives a new (symbol, LLR) pair as input for the comparison in the next cycle.

In one embodiment, the four FIFO memories receive the values respectively corresponding to the four subsets corresponding to a matrix exploration path during the initialization phase of the algorithm. In other words, the values of each subset are calculated in advance, and the pre-calculated values are stored in the FIFO memories during initialization of the exploration algorithm.

Alternatively, it can be arranged so that for each selection subset, only a number of values corresponding to the size of the corresponding FIFO are calculated. For example, again using the four subsets($□_□$)$_{□=1,...,4}$ respectively associated with the bubble paths described above and defined by the following equations:

$$□_1 = [□(0) + □(□); □ \in \{0, \cdots, □_□ - 1\}]$$

$$□_2 = [□(0) + □(□); □ \in \{1, \cdots, □_□ - 1\}]$$

$$□_3 = \left[□(1) + □(□); □ \in \left\{1, \cdots, \frac{□_□}{2} - 1\right\}\right]$$

$$□_4 = \left[□(1) + □(□); □ \in \left\{2, \cdots, \frac{□_□}{2} - 1\right\}\right],$$

One pre-calculates the ($□_□/2$)−1 first values of $□_1$ that are stored in the first FIFO memory (405a) of a size chosen to be equal to ($□_□/2$)−1, one pre-calculates the ($□_□/2$)−2 first values of $□_2$ that are stored in the second FIFO memory (405b) of a size chosen to be equal to ($□_□/2$)−2, one pre-calculates the ($□_□/2$)−2 first values of $□_3$ that are stored in the third FIFO memory (405c) of a size chosen to be equal to ($□_□/2$)−2, and one pre-calculates the ($□_□/2$)−3 first values of $□_4$ that are stored in the fourth FIFO memory (405d) of a size chosen to be equal to ($□_□/2$)−3.

Thus, each iteration of the exploration algorithm is reduced to only two-way comparisons for selecting a value among the first output values from the four FIFOs, the step of replacing the selected value being limited to updating the output index of the FIFO memory from which the selected value originated.

This architecture proves to be more efficient than an architecture where the elements of the subsets corresponding to the predefined bubble paths are not pre-calculated. This is surprising, as more operations are performed for pre-calculating subset elements than in an algorithm where these elements are calculated as the exploration algorithm is executed, in order to replace a selected item in one of the FIFO memories. This performance improvement results from the fact that the control loop of the algorithm no longer includes an operation of calculating the element replacing the selected element, but simply updates an index in the FIFO memory where it originated. The algorithm control loop in this embodiment is therefore simplified, giving increased efficiency to an architecture using FIFO memories.

Pre-calculation of the elements placed in FIFO memories also allows reducing the size of the memory used by the exploration algorithm. Indeed, in one embodiment, memories U (401) and V (402) are no longer used, and the FIFO memories are supplied values directly during the phase of pre-calculating the elements of the bubble path.

Of course, the proposed architecture is not limited to a particular implementation of the memories, in particular the FIFO memories. It may make use of memory means configured to implement FIFO stacks with software, or any other configuration of memory means for forming FIFO stacks.

Figure 9:
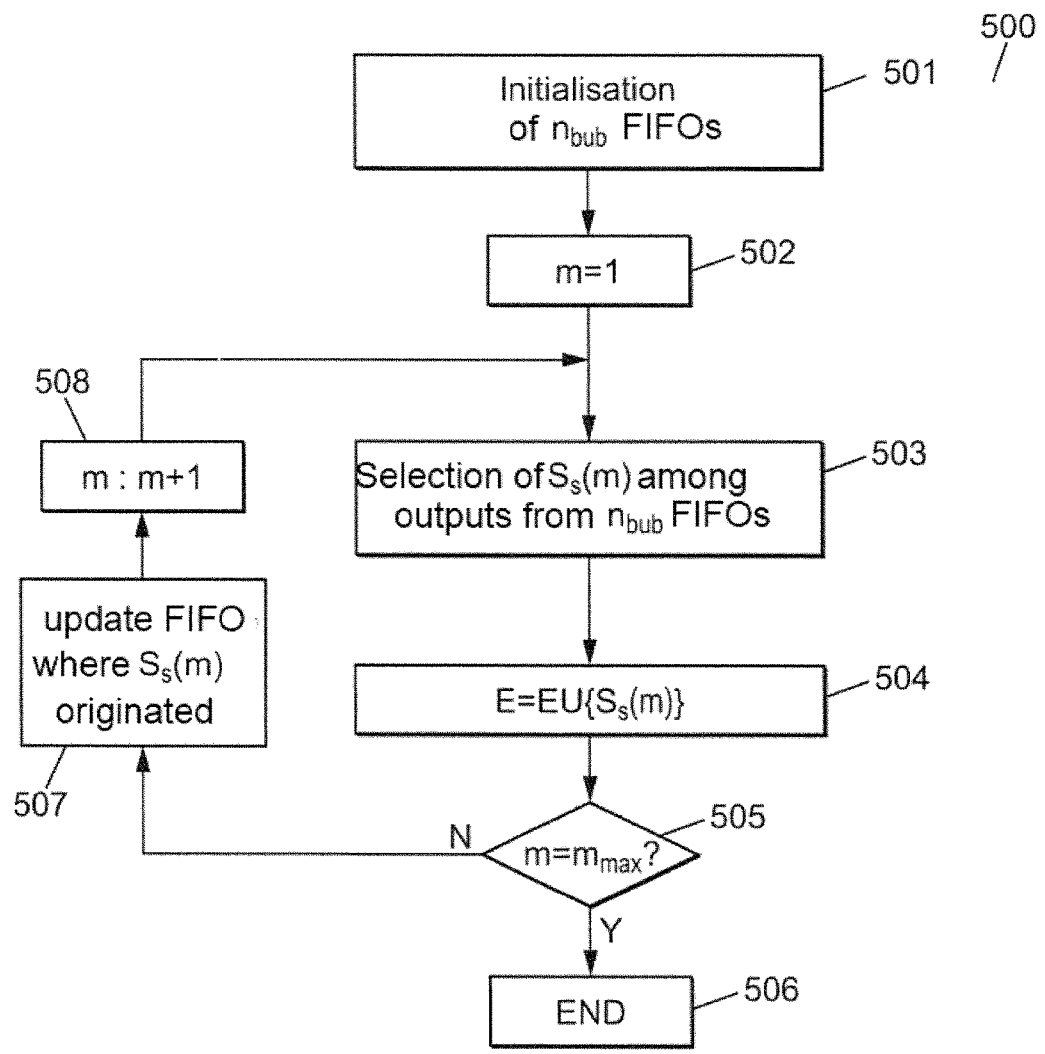
FIG. 9 is a diagram illustrating certain aspects of implementing the proposed method.

FIG. 9 illustrates an algorithm for implementing the proposed method (500) corresponding to the architecture described above, in one particular embodiment.

The values of the $n_{bub}$ ($□_{□□□} \in N$; $□_{□□□} > 1$) FIFO memories are initialized (501) to the subset values ($□_□$)$_{□=1, \ldots, □□□□}$, which correspond to the elements of the $n_{bub}$ paths (of $n_{bub}$ bubbles) that they respectively define. A loop index m is also initialized (502), for example to the value 1: $□=1$.

An iteration of the algorithm is then performed, with selection (503) of a value, denoted $□□(□)$, from among the output values from the $n_{bub}$ FIFO memories, on the basis of a criterion concerning the corresponding measure of reliability. The elements stored in the FIFO memories can be (symbol, reliability) pairs, in which case selecting $□□(□)$ consists of selecting the most reliable pair among the pairs of output values from each FIFO memory. As a variant, the elements stored in the FIFO memories can be values representing reliabilities (for example log-likelihood ratios LLRs as defined above), in which case selecting Ss(m) consists of selecting the output element corresponding to the highest reliability. Depending on the representation chosen for the reliability values, this selection could consist of a comparison, for example a two-way comparison as explained above, of the output elements from the FIFO memories in order to select, for example, the smallest element.

The output message $□$ is then updated (504) with the selected value: $□=□\cup\{□□(□)\}$.

The iteration loop index $□$ is then compared (505) to a predetermined end-of-loop value $m_{max}$, for example chosen to be equal to $□_□$, in order to check whether the maximum number of planned iterations has been reached. If less than $□_{□□□}$ iterations have been performed, the loop index $□$ is incremented (508) and a new iteration is initiated. Otherwise, the algorithm ends (506).

The incrementing of the iteration index is followed or preceded by updating the output index of the FIFO memory from which the element Ss(m) originated. For example, if the selected element $□_□(□)$ is from the FIFO of index k, $FIFO_k$, the output index for this $FIFO_k$ is incremented so that the next element Ss(m) in this FIFO is considered for the next iteration of the algorithm.

Embodiments of the proposed methods may be at least partially implemented on virtually any type of computer, regardless of the platform used. For example, as shown in FIG. 2a, a computer system (100) comprises a data processing unit (105) that comprises one or more processors, such as a central processing unit (CPU) or some other hardware processor, associated memory (104) (for example random access memory (RAM), cache memory, flash memory, etc.), a data storage device (104) (for example a hard disk, optical disk such as a CD or DVD, a flash memory stick, etc.), and many other typical elements and functionalities of current computers (not shown). In general, the computer system (100) comprises at least the minimal processing means, input and/or output means required to implement one or more embodiments of the proposed methods. For example, the processor (105) is capable of being configured to execute a computer program comprising portions of code for implementing an output message generator, configured to generate elements of the output message of the parity-check node implemented by the system (100) according to the various embodiments of the proposed method.

Although the elementary parity-check node, and in particular the output message generator, are described as being in software form, they can be implemented as hardware or as a combination of hardware and of software instructions.

Depending on the chosen embodiment, certain acts, actions, events, or functions of each of the methods described herein may be performed or may occur in a different order than that described, or may be added, combined, or may not be performed or may not occur, as appropriate. Additionally, in some embodiments, certain acts, actions, or events are performed or occur concurrently and not sequentially.

Although described using a number of detailed implementation examples, the proposed method for managing a parity-check node calculation unit and the calculation unit for implementing the method comprise different variations, modifications, and improvements which will be apparent to those skilled in the art, it being understood that these variations, modifications, and improvements lie within the scope of the invention as defined by the following claims. In particular, although the various embodiments described above implement a number of bubbles equal to 4, the proposed method for managing a parity-check node calculation unit and the calculation unit for implementing the method can be implemented with a different number of bubbles $n_{bub}$ greater than or equal to two.

In addition, although the various embodiments described above implement addition operations between input message elements, the invention also applies to calculation operations φ where φ is a function satisfying the property: if a≥b and c≥d, then φ (a,c)≥φ (b,d).

Similarly, although the invention has been described in its application to the elements of a Galois field GF (q), it also applies to the elements of a set having at least one internal law of composition.

In addition, various aspects and features described above may be implemented together or separately, or substituted for each other, and all the various combinations and subcombinations of the aspects and features lie within the scope of the invention. In addition, some of the systems and devices described above may not incorporate all of the modules and functions described for the preferred embodiments.

The invention claimed is:

1. A method for managing a parity-check node calculation unit of a non-binary error-correcting code decoder having a representation as a bipartite graph comprising at least one parity-check node, the parity-check node being configured to receive first (U) and second (V) input messages, and to produce an output message (E), elements of the input and output messages of the parity-check node comprising a symbol and a measure of reliability associated with the symbol, the first and second input messages containing lists U(i) and V(j) of length $n_m$ of elements ordered by their measure of reliability, $n_m$ being even, i and j being integer indices respectively indexing the elements of the lists U(i) and V(j), said method comprising:

initializing four FIFO (First In, First Out) memories with elements calculated, according to a calculation operation φ (U(i), V(j)), from combinations of elements of the first and second input messages, said calculation operation φ being such that for elements a, b, c and d of the input messages, if the measure of reliability of a is greater than or equal to the measure of reliability of b and the measure of reliability of c is greater than or equal to the measure of reliability of d, then the measure of reliability of φ (a,c) is greater than or equal to the measure of reliability of φ (b,d); and iteratively determining values of the output message, where an iteration of order k, k being an integer greater than or equal to zero, comprises:

selecting from among the output elements from the FIFO memories a k-th element Ss(k) having maximum reliability;

generating an element of the output message (E) from the selected k-th element Ss(k);

updating the output of the FIFO memory from which the m-th selected element Ss(k) originated;

wherein the four FIFO memories are initialized with elements from four subsets S1, S2, S3, and S4, generated by combining the measures of reliability respectively associated with elements U(i) and V(j) of the input messages as follows:

$$S_1 = [\varphi(U(0) + V(l)); l \in \{0, \cdots, n_m - 1\}]$$

$$S_2 = [\varphi(V(0) + U(l)); l \in \{1, \cdots, n_m - 1\}]$$

$$S_3 = \left[\varphi(U(1) + V(l)); l \in \left\{1, \cdots, \frac{n_m}{2} - 1\right\}\right]$$

$$S_4 = \left[\varphi(V(1) + U(l)); l \in \left\{2, \cdots, \frac{n_m}{2} - 1\right\}\right].$$

2. The method according to claim 1, wherein the four FIFO memories are initialized according to their sizes, which are respectively chosen as being equal to:

$$\frac{n_m}{2} - 1, \frac{n_m}{2} - 2, \frac{n_m}{2} - 2, \text{ and } \frac{n_m}{2} - 3.$$

3. The method according to claim 1, wherein the generation of an element of the output message (E) from the selected element Ss (m) is carried out only if the output message E does not already contain said element.

4. The method according to claim 1, wherein the measure of reliability of each element is represented by a log-likelihood ratio.

5. The method according to claim 1, wherein the calculation operation φ is an addition.

6. The method according to claim 1, wherein the error-correcting code decoder is a decoder for non-binary LDPC codes.

7. A non-transitory computer-readable medium comprising computer program instructions, the execution of which by a processor causing acts for managing a parity-check node calculation unit of a non-binary error-correcting code decoder having a representation as a bipartite graph comprising at least one parity-check node, the parity-check node being configured to receive first (U) and second (V) input messages, and to produce an output message (E), elements of the input and output messages of the parity-check node comprising a symbol and a measure of reliability associated with the symbol, the first and second input messages containing lists U(i) and V(j) of length $n_m$ of elements ordered by their measure of reliability when said program is executed by the processor, $n_m$ being even, i and j being integer indices respectively indexing the elements of the lists U(i) and V(j), said acts comprising:

initializing four FIFO (First In, First Out) memories with elements calculated, according to a calculation operation φ (U(i),V(j)), from combinations of elements of the first and second input messages, said calculation operation φ being such that for elements a, b, c and d of the input messages, if the measure of reliability of a is greater than or equal to the measure of reliability of b and the measure of reliability of c is greater than or equal to the measure of reliability of d, then the measure of reliability of φ (a,c) is greater than or equal to the measure of reliability of φ (b,d); and iteratively determining values of the output message, where an iteration of order k, k being an integer greater than or equal to zero, comprises:

selecting from among the output elements from the FIFO memories a k-th element Ss(k) having maximum reliability;

generating an element of the output message (E) from the selected k-th element Ss(k);

updating the output of the FIFO memory from which the selected k-th element Ss(k) originated;

wherein the four FIFO memories are initialized with elements from four subsets S1, S2, S3, or S4, generated by combining the measures of reliability respectively associated with elements U(i) and V(j) of the input messages, as follows:

$$S_1 = [\varphi(U(0) + V(l)); l \in \{0, \cdots, n_m - 1\}]$$

$$S_2 = [\varphi(V(0) + U(l)); l \in \{1, \cdots, n_m - 1\}]$$

$$S_3 = \left[\varphi(U(1) + V(l)); l \in \left\{1, \cdots, \frac{n_m}{2} - 1\right\}\right]$$

$$S_4 = \left[\varphi(V(1) + U(l)); l \in \left\{2, \cdots, \frac{n_m}{2} - 1\right\}\right].$$

8. The computer program according to claim 7, containing a set of data processed by means of compression or encoding.

9. A parity-check node calculation unit of a non-binary error-correcting code decoder having a representation as a bipartite graph, the parity-check node being configured to receive first (U) and second (V) input messages, and to produce an output message (E), elements of the input and output messages of the parity-check node comprising a symbol and a measure of reliability associated with the symbol, the first and second input messages containing lists U(i) and V(j) of length $n_m$ of elements ordered by their measure of reliability, $n_m$ being even, i and j being integer indices respectively indexing the elements of the lists U(i) and V(j), the calculation unit comprising:

a computer processor operatively coupled to memory means, the memory means being configured as four FIFO (First In, First Out) memories;

an output message generator, executed by the computer processor and configured to:

initialize the four FIFO memories with elements calculated, according to a calculation operation φ (U(i), V(j)), from combinations of elements of the first and second input messages, said calculation operation φ being such that for elements a, b, c and d of the input messages, if the measure of reliability of a is greater than or equal to the measure or reliability of b and the measure of reliability of c is greater than or equal to the measure of reliability of d, then the measure or reliability of φ (a,c) is greater than or equal to the measure of reliability of φ (b,d); and determine values of the output message iteratively, where an iteration of order k, k being an integer greater than or equal to zero, comprises:

selecting from among the output elements of the FIFO memories an element k-th Ss(k) having maximum reliability;

generating an element of the output message (E) from the selected k-th element Ss(k); and updating the output of the FIFO memory from which the selected k-th element Ss(k) originated;

wherein the four FIFO memories are initialized with elements from four subsets S1, S2, S3, and S4, generated by combining the measures of reliability respectively associated with elements U(i) and V(j) of the input messages, as follows:

$$S_1 = [\varphi(U(0), V(l)); l \in \{0, \ldots, n_m - 1\}]$$

$$S_2 = [\varphi(V(0), U(l)); l \in \{1, \ldots, n_m - 1\}]$$

$$S_3 = \left[\varphi(U(1), V(l)); l \in \left\{1, \ldots, \frac{n_m}{2} - 1\right\}\right]$$

$$S_4 = \left[\varphi(V(1), U(l)); l \in \left\{2, \ldots, \frac{n_m}{2} - 1\right\}\right].$$

10. The calculation unit according to claim 9, wherein the four FIFO memories are initialized according to their sizes, which are respectively chosen to be equal to:

$$\frac{n_m}{2} - 1, \; \frac{n_m}{2} - 2, \; \frac{n_m}{2} - 2, \; \text{and} \; \frac{n_m}{2} - 3.$$

11. The calculation unit according to claim 9, wherein the generation of an element of the output message (E) from the selected k-th element Ss(k) is carried out only if the output message E does not already contain said element.

12. The calculation unit according to claim 9, wherein the measure of reliability of each element is represented by a log-likelihood ratio.

13. The calculation unit according to claim 9, wherein the calculation operation φ is an addition.

14. The calculation unit according to claim 9, wherein the error-correcting code decoder is a decoder for non-binary LDPC codes.

* * * * *